United States Patent
Nishizono

(10) Patent No.: US 6,714,063 B2
(45) Date of Patent: Mar. 30, 2004

(54) CURRENT PULSE RECEIVING CIRCUIT

(75) Inventor: Kazunori Nishizono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/214,149

(22) Filed: Aug. 8, 2002

(65) Prior Publication Data

US 2002/0190777 A1 Dec. 19, 2002

Related U.S. Application Data

(62) Division of application No. 09/922,764, filed on Aug. 7, 2001, now Pat. No. 6,456,141.

(30) Foreign Application Priority Data

Jan. 30, 2001 (JP) ............................................ 2001-21224

(51) Int. Cl.[7] ................................................. G06G 7/18

(52) U.S. Cl. ...................................... 327/345; 327/101

(58) Field of Search ................................ 327/101, 102, 327/103, 345, 52, 53, 530; 323/312, 313, 315; 250/214 A; 363/13, 73; 330/252, 288, 277, 257, 258, 261

(56) References Cited

U.S. PATENT DOCUMENTS

| | | | |
|---|---|---|---|
| 4,292,469 A | | 9/1981 | Scott et al. .................. 704/208 |
| 4,588,956 A | * | 5/1986 | de Corlieu et al. ............. 330/2 |
| 5,057,683 A | | 10/1991 | Fukuyama ............... 250/214 B |
| 5,757,221 A | | 5/1998 | Hayashi ...................... 327/360 |
| 6,091,287 A | | 7/2000 | Salter et al. ................. 327/345 |
| 6,114,686 A | * | 9/2000 | Funahashi ............... 250/214 A |
| 6,300,752 B1 | * | 10/2001 | Mack .......................... 323/313 |
| 6,414,558 B1 | * | 7/2002 | Ryan et al. .................. 327/164 |

* cited by examiner

Primary Examiner—Timothy P. Callahan
Assistant Examiner—Linh Nguyen
(74) Attorney, Agent, or Firm—Arent Fox Kintner Plotkin & Kahn, PLLC

(57) ABSTRACT

A current pulse receiving circuit suitable for converting a current pulse converted by a photodetector from a light pulse received in optical communications and outputting a logic level voltage pulse with an accurate pulse width is disclosed. When an output signal from a current-to-voltage converter circuit is detected to have a large amplitude by a large signal detection circuit, an amount of offset cancellation of a DC cancellation circuit is decreased to limit the amplitude of the output signal from the current-to-voltage converter circuit. Since the amplitude of an input signal of an amplifier circuit is limited, tail characteristics at a trailing edge of a pulse are small and an output is provided at an output terminal with an accurate pulse width.

5 Claims, 33 Drawing Sheets

CIRCUIT BLOCK DIAGRAM ACCORDING TO AN EIGHTH EMBODIMENT

FIG. 1  CIRCUIT BLOCK DIAGRAM ACCORDING TO A FIRST EMBODIMENT

INPUT AND OUTPUT WAVEFORMS WITH A SINGLE INPUT TO A COMPARATOR CIRCUIT ACCORDING TO THE FIRST EMBODIMENT

FIG. 4 TYPICAL CURRENT PULSE RECEIVING CIRCUIT ACCORDING TO THE FIRST EMBODIMENT

FIG. 5 INPUT AND OUTPUT WAVEFORMS IN THE TYPICAL CURRENT PULSE RECEIVING CIRCUIT ACCORDING TO THE FIRST EMBODIMENT

FIG. 6 CIRCUIT DIAGRAM ACCORDING TO A SECOND EMBODIMENT

FIG. 8 CIRCUIT DIAGRAM ACCORDING TO A THIRD EMBODIMENT

FIG. 9 CIRCUIT DIAGRAM ACCORDING TO A FOURTH EMBODIMENT

INPUT AND OUTPUT WAVEFORMS ACCORDING TO THE FOURTH EMBODIMENT (WITHOUT A PEAK HOLD)

FIG. 11 CIRCUIT DIAGRAM ACCORDING TO A FIFTH EMBODIMENT

INPUT AND OUTPUT WAVEFORMS ACCORDING TO THE FIFTH EMBODIMENT

FIG. 13 CIRCUIT DIAGRAM SHOWING ESSENTIAL PORTIONS OF A FIRST EXAMPLE ACCORDING TO A SIXTH EMBODIMENT

TYPICAL CURRENT-TO-VOLTAGE CONVERTER CIRCUIT

RELATIONSHIP BETWEEN CHARACTERISTICS OF A LARGE SIGNAL DETECTION CIRCUIT AND A CURRENT-TO-VOLTAGE CONVERTER CIRCUIT

INPUT AND OUTPUT WAVEFORMS OF THE FIRST EXAMPLE ACCORDING TO THE SIXTH EMBODIMENT

FIG. 17 SECOND EXAMPLE ACCORDING TO THE SIXTH EMBODIMENT

INPUT AND OUTPUT WAVEFORMS OF THE SECOND EXAMPLE ACCORDING TO THE SIXTH EMBODIMENT

TEMPERATURE CHARACTERISTICS CANCELLATION BIAS CIRCUIT FOR A CURRENT-TO-VOLTAGE CONVERTER CIRCUIT ACCORDING TO A SEVENTH EMBODIMENT

FIG. 20 CIRCUIT BLOCK DIAGRAM ACCORDING TO AN EIGHTH EMBODIMENT

INPUT AND OUTPUT WAVEFORMS WHEN THE INPUT TO AN AMPLIFIER CIRCUIT ACCORDING TO THE EIGHTH EMBODIMENT IS A DIFFERENTIAL INPUT

INPUT AND OUTPUT WAVEFORMS WHEN THE INPUT TO THE AMPLIFIER CIRCUIT ACCORDING TO THE EIGHTH EMBODIMENT IS A SINGLE INPUT

FIG. 23 TYPICAL CURRENT PULSE RECEIVING CIRCUIT ACCORDING TO THE EIGHTH EMBODIMENT

FIG. 24 CIRCUIT BLOCK DIAGRAM ACCORDING TO A NINTH EMBODIMENT

FIG. 25 TYPICAL CURRENT PULSE RECEIVING CIRCUIT ACCORDING TO THE NINTH EMBODIMENT

LIGHT PULSE RECEIVING CIRCUIT ACCORDING TO A FIRST RELATED ART

LIGHT PULSE RECEIVING CIRCUIT ACCORDING TO A SECOND RELATED ART

INPUT AND OUTPUT RESPONSE WAVEFORMS OF A COMPARATOR CIRCUIT IN THE LIGHT PULSE RECEIVING CIRCUIT ACCORDING TO THE FIRST RELATED ART

INPUT AND OUTPUT RESPONSE WAVEFORMS OF A COMPARATOR CIRCUIT IN THE LIGHT PULSE RECEIVING CIRCUIT ACCORDING TO THE SECOND RELATED ART

INPUT AND OUTPUT RESPONSE WAVEFORMS OF AN AMPLIFIER CIRCUIT UNDER A HIGH INTENSITY IN THE LIGHT PULSE RECEIVING CIRCUIT ACCORDING TO THE FIRST RELATED ART

INPUT AND OUTPUT RESPONSE WAVEFORMS OF THE AMPLIFIER CIRCUIT UNDER A LOW INTENSITY IN THE LIGHT PULSE RECEIVING CIRCUIT ACCORDING TO THE FIRST RELATED ART

INPUT AND OUTPUT RESPONSE WAVEFORMS OF AN AMPLIFIER CIRCUIT UNDER A HIGH INTENSITY IN THE LIGHT PULSE RECEIVING CIRCUIT ACCORDING TO THE SECOND RELATED ART

INPUT AND OUTPUT RESPONSE WAVEFORMS OF THE AMPLIFIER
CIRCUIT UNDER A LOW INTENSITY IN THE LIGHT PULSE RECEIVING
CIRCUIT ACCORDING TO THE SECOND RELATED ART

CURRENT PULSE RECEIVING CIRCUIT

This is a division application Ser. No. 09/922,764 filed Aug. 7, 2001 now U.S. Pat. No. 6,456,171. The disclosure of the prior application(s) is hereby incorporated by reference herein in its entirety.

BACKGROUND OF THE INVENTION

1. Field of the Invention

The present invention relates to a current pulse receiving circuit that coverts an input current pulse to a corresponding logic level voltage pulse and outputs the voltage pulse with an accurate pulse width. More particularly, the invention relates to a current pulse receiving circuit used, in optical communications and similar application fields, after a received light pulse is converted to a corresponding current pulse by a photodetector.

2. Description of the Related Art

Recent developments in the telecommunications field has seen an infrared data communications (IrDA communications) function using infrared rays to connect spaces added to portable terminals, personal computers, and cellular phones. Fiber-optic communications networks are being established to build and expand a telecommunications infrastructure.

In optical communications systems such as those noted above, sunlight, illumination by fluorescent lamps and other lighting devices, and other disturbance light are also applied to a photodiode and other types of photodetectors depending on the brightness of the environment in which the equipment is used. These disturbance lights function to energize the photodetector and allow unwanted DC current components to flow through the current pulse receiving circuit. This makes it necessary to remove these DC current components.

The light pulse signals being transmitted and received are generally burst signals whose pulse width and duty ratio vary. Because of its characteristics, the photodiode PD tends to develop rounding on a rising edge and a falling edge of a current output, resulting at times in tail dragging. Furthermore, it is common, from the viewpoint of removing DC offset components, to use a differentiated waveform which is the result of differentiating the pulse signal, which contributes to tail dragging of the output signal. A region of such tail dragging is more conspicuous when the signal has a wider pulse width, which could cause a comparator circuit or amplifier circuit to malfunction so that it inverts its output state. As a means for producing an output of a logic pulse having an accurate pulse width by preventing this malfunction and maintaining the correct output state, it has been conventional practice to add to an input signal to the comparator circuit or the amplifier circuit a hysteresis voltage or other significant differential voltage. This means also contributes to improved noise resistance.

FIG. 26 shows a current pulse receiving circuit 100 as a first related art. A light pulse is received by a photodiode PD and converted to a current pulse IPD. The current pulse IPD is applied to an input node IN of a current-to-voltage converter circuit 101A, in which it is converted to a corresponding voltage which, in turn, is applied to an inverting input terminal VM2 of an amplifier circuit 102A. Though the figure typically shows a single input terminal for the current-to-voltage converter circuit 101A, the circuit may also be configured as a differential input by using a noninput terminal as a dummy terminal or applying a complementary current pulse. A DC cancellation circuit 105A detects a DC voltage level of an output signal VM2 from the current-to-voltage converter circuit 101A and feeds it back to the input node IN of the current-to-voltage converter circuit 101A, thereby canceling DC disturbance light, such as sunlight and illuminating light, which are to be converted to corresponding current values by the photodiode PD. It sets a time constant sufficiently large with respect to the input light pulse, thereby canceling only the disturbance light components whose input frequencies are less than several kHz. The DC cancellation circuit 105A may be configured as a differential output to coincide with the differential input of the current-to-voltage converter circuit 101A.

The pulse signal converted to a corresponding voltage by the current-to-voltage converter circuit 101A is input to, and amplified by, the amplifier circuit 102A. The amplifier circuit functions to improve response in a comparator circuit 103 at a later stage. A signal is provided from a DC feedback circuit 106 to a reference voltage terminal VP2 of the amplifier circuit 102A. The DC feedback circuit 106 uses an integrating circuit C101, R101, and R102 to integrate a voltage developing at an output terminal VP3 of the amplifier circuit 102A and feeds back the resultant voltage to the reference voltage terminal VP2 of the amplifier circuit 102A, thereby improving an input offset voltage in the amplifier circuit 102A. At the same time, it follows changes in a signal input to the inverting input terminal VM2 with a lag, thus offering a function of adding hysteresis effect between input terminals.

An output from the amplifier circuit 102A is applied to the comparator circuit 103 via the output terminal VP3 and, through a comparison made with a reference voltage VTH coupled to a reference voltage terminal VM3, a positive logic pulse is output. This positive logic pulse is inverted at an inverter circuit 104 and a negative logic pulse is output from an output terminal RX as the output from the current pulse receiving circuit 100.

FIG. 27 shows a current pulse receiving circuit 200 as a second related art. It has the same basic circuit configuration as the current pulse receiving circuit 100 shown in FIG. 26. In the current pulse receiving circuit 200, the output signal from a current-to-voltage converter circuit 101B is subjected to capacitive coupling through capacitive components C102 and C103 to the input terminal of an amplifier circuit 102B, thereby improving the input offset voltage in the amplifier circuit 102B. Therefore, a DC cancellation circuit 105B also has a differential input configuration.

Like the current pulse receiving circuit 100, the DC cancellation circuit 105B functions to cancel DC offset caused by disturbance light. In addition, the input offset voltage in the amplifier circuit 102B is improved through capacitive coupling to the input terminal of the amplifier circuit 102B and, at the same time, a significant differential voltage is added between input signals through the input of a differential signal.

However, due to the tail characteristic of a current output determined by the output characteristics of the photodiode PD and a difference in tail characteristics and others in the differentiated waveform of the pulse signal, in addition to widely varying light pulse widths involved with burst signals in IrDA communications and other optical communications, it is difficult to stably establish a hysteresis voltage width sufficient to prevent erroneous outputs from the comparator circuit 103 even in the tail region of current outputs. That is, the setting value deviates between photodiodes PD that have different tail characteristics in output currents. With the differentiated waveform, too, the tail region varies for different constants of the photodiode PD and differentiating circuit and input signal amplitudes. Moreover, the tail region occurs differently according to the strength of the light pulse received, the clamp level of the current pulse IPD, and other factors. The tail characteristic is thus variable depending on the characteristics of the parts used, circuit constant of the differentiating and other circuits, and operating environment, thus presenting a problem in which it is difficult to stably provide an output with a highly accurate pulse width for a light pulse having a long pulse width.

As an example, FIG. 28 shows input and output waveforms of response of the comparator circuit 103 in the first related art. In this case, the amplifier circuit 102A provides a single output supplied to the noninverting input terminal VP3 and a signal having a predetermined hysteresis voltage width with respect to the reference voltage VTH is supplied to the reference voltage terminal VM3. A shorter current pulse IPD with respect to the predetermined hysteresis voltage width provides an output signal RX with a highly accurate pulse width. With a longer current pulse IPD, however, the input signal VP3 applied to the comparator circuit 103 as a differentiated waveform drags its tail. This causes the input relation of the comparator circuit 103 to be inverted in the middle of the input current pulse IPD width, thus inverting the output signal RX. FIG. 29 shows input and output waveforms of response of the comparator circuit 103 in the second related art. In this case, the output from the amplifier circuit 102B is a differential output, being supplied to each of the input terminals VP3 and VM3. Because it is a differential signal, the output signal RX with a highly accurate pulse width is provided with a short current pulse IPD. Since the differential signal is a differentiated waveform that drags its tail, however, the input relation of the comparator circuit 103 is inverted in the middle of the input current pulse IPD width with a longer current pulse IPD, thus inverting the output signal RX.

When adding a predetermined hysteresis voltage width to the reference voltage VTH for a single input signal as that shown in FIG. 28, an improvement can be made if the hysteresis voltage width is set large. If the hysteresis voltage width is set to a level larger than the amplitude of a small input signal, however, the set hysteresis voltage can no longer be reset, causing the output terminal RX to be locked in the set position. This presents a problem.

If the intensity of an input light pulse is high, the output voltage amplitude is clamped at the current-to-voltage converter circuits 101A and 101B. For this clamping operation, it is common to use a forward voltage of a junction in a bipolar transistor or a diode and it is therefore impossible to set the output voltage amplitude during the clamping operation to a level lower than the forward voltage of the junction. As a result, the difference from the output voltage amplitude under low intensity becomes too large, which makes the tail waveform due to photodiode PD characteristics at the trailing edge of the pulse under high intensity prominent as compared with that under a low intensity. This disables accurate detection of the trailing edge of the pulse under high intensity, causing the pulse width at the output terminal RX to be wider than it actually is.

As specific examples, FIG. 30 shows a response waveform of the amplifier circuit 102A according to the first related art, while FIG. 32 shows a response waveform of the amplifier circuit 102B according to the second related art. In both cases, a tail waveform arising from the photodiode PD output characteristics is noticeable at the trailing edge of the pulse waveform VM2, which causes the point of intersection with the reference voltage VP2 (in FIG. 30) or the complementary voltage VP2 (in FIG. 32) to lag with respect to the actual trailing edge of the light pulse, thus making the pulse width at the output terminal RX large.

Furthermore, if the intensity of the input light pulse is low, the input light pulse is not subjected to a clamping operation, letting the output characteristics of the photodiode PD be output as they are. This makes the tail waveform prominent both at the leading edge and the trailing edge of the pulse. Since the voltage difference between input signals at the leading edge of the pulse is in a direction in which there is greater potential difference, however, there is no response lag at the leading edge of the pulse at the output terminal RX. At the trailing edge of the pulse, however, the tail waveform acts to retard the intersection of input signals. Therefore, as in the case of high intensity it is not possible to accurately detect the trailing edge of the pulse, thus making the pulse width at the output terminal RX larger than it actually is.

As examples, FIG. 31 shows a response waveform of the amplifier circuit 102A according to the first related art, while FIG. 33 shows a response waveform of the amplifier circuit 102B according to the second related art. In both cases, the tail waveform arising from the photodiode PD output characteristics at the trailing edge of the pulse waveform VM2 causes the point of intersection with the reference voltage VP2 (in FIG. 31) or the complementary voltage VP2 (in FIG. 33) to lag with respect to the actual trailing edge of the light pulse, thus making the pulse width at the output terminal RX large.

In optical communications including the IrDA communications covering also the infrared region, the light pulse signals transmitted and received are generally burst signals with varying pulse widths and duty ratios. Furthermore, the intensity of the light being transmitted varies greatly depending on the transmission distance and transmission environment of the light pulse signals. A problem therefore exists in which an accurate pulse width cannot be output with varying pulse widths and varying light intensities as noted above.

SUMMARY OF THE INVENTION

It is therefore an object of the invention to provide a current pulse receiving circuit that converts a current pulse, which has been converted by a photodetector from a light pulse received in optical communications, to a corresponding logic level voltage pulse and outputs the voltage pulse with an accurate pulse width.

To achieve the foregoing object, one aspect of the invention provides a current pulse receiving circuit comprising a current-to-voltage converter portion that converts an input current pulse to a corresponding voltage pulse, a comparator circuit that compares an output signal from the current-to-voltage converter portion with a signal complementary to the output signal or a reference voltage and outputs a logic signal pulse, a first hysteresis circuit that sets a hysteresis voltage of a first predetermined width to the comparator circuit input signal based on the logic signal pulse, and a second hysteresis circuit that sets a hysteresis voltage that decreases with time from a second predetermined width.

In the current pulse receiving circuit, when the comparator circuit outputs a logic signal pulse after an input current pulse has been converted to a corresponding voltage pulse by the current-to-voltage converter portion, a hysteresis voltage of the first predetermined width set by the first hysteresis circuit is added to, and then a hysteresis voltage that decreases with time from the second predetermined width and is set by the second hysteresis circuit is superimposed over, the input signal based on the logic signal pulse.

Therefore, if the first predetermined width of the hysteresis voltage is set by the first hysteresis circuit and the second predetermined width and the rate of decrease with time are set by the second hysteresis circuit so that an ample hysteresis voltage width is provided for the maximum pulse width in the voltage pulse converted from the input current pulse, it is then possible to set a hysteresis voltage width sufficient for voltage pulses of all pulse widths. If the receiving circuit is applied to optical communications including IrDA communications, it is possible to stably set a hysteresis voltage width sufficient for preventing the comparator circuit from producing an erroneous output even in the tail region by absorbing variations in the output characteristics of the photodiode that converts a light pulse to a corresponding current pulse and in the tail characteristics in a differentiated waveform of the pulse signal, in addition to widely varying light pulse widths involved with the burst signals. In particular, a highly accurate output pulse width can be stably output over a pulse range of the longest pulse width as determined according to the settings of the second predetermined width and the rate of decrease with time made by the second hysteresis circuit. The receiving circuit is suitable for use in optical communications including the IrDA communications, in which the longest input light pulse width is fixed.

While retaining the sum of the first predetermined width and the second predetermined width immediately after they have been set, the hysteresis voltage width gradually decreases with time and eventually diminishes to the first predetermined width. The problem, in which a set hysteresis voltage cannot be canceled and the output terminal is locked in a set position, can therefore be prevented by setting the first predetermined width to an amplitude of that less than a small-amplitude input signal.

Another aspect of the invention provides a current pulse receiving circuit comprising a current-to-voltage converter circuit that converts an input current pulse to a corresponding voltage pulse, a large signal detection circuit that detects that the voltage amplitude of the output signal from the current-to-voltage converter circuit is equal to or greater than a predetermined amplitude, and a clamp circuit that reduces a current-to-voltage conversion resistance in the current-to-voltage converter circuit and reduces the clamp level of the output voltage amplitude according to the output signal from the large signal detection circuit.

In the current pulse receiving circuit according to the second aspect of the invention, when the large signal detection circuit detects that the voltage amplitude of the voltage pulse converted from the input current pulse by the current-to-voltage converter circuit is equal to or greater than a predetermined amplitude, the clamp circuit reduces the clamp level of the output voltage amplitude, while at the same time reducing the current-to-voltage conversion resistance in the current-to-voltage converter circuit.

If the voltage amplitude of the voltage pulse of the output signal from the current-to-voltage converter circuit is found to be equal to or greater than a predetermined amplitude, the current-to-voltage conversion resistance is reduced. This allows the change in the voltage amplitude of the output voltage to be controlled at a low level with respect to the change in the current amplitude in the input current pulse, thus enabling conversion to a voltage signal with an accurate pulse width over a current amplitude range of wider input current pulses whose amplitudes are equal to or greater than a predetermined level. Moreover, reducing the clamp level of the output voltage amplitude permits limitation of the maximum voltage amplitude, which allows an input current pulse with a large amplitude to be converted to a voltage pulse signal with a highly accurate pulse width.

Since the output voltage amplitude is also restricted to a small level for an input current pulse of a large amplitude, the tail waveform in an output voltage signal presents no problem. The trailing edge of an input current pulse of a large amplitude can be accurately detected, thus realizing an output of a pulse width with high accuracy.

In addition to strong and weak light pulse signals involved with the IrDA communications and other forms of optical communications, variations in the output characteristics of the photodiode PD that converts a light pulse to a corresponding current pulse and in tail characteristics in a differentiated waveform of the pulse signal are absorbed, thus allowing an output pulse width to be stably output in accurate correspondence with the pulse width of the input light pulse.

A current pulse receiving circuit according to still another aspect of the invention comprises a current-to-voltage converter circuit that converts an input current pulse to a corresponding voltage pulse, an amplifier circuit of a differential input configuration that performs amplification according to the output signal from the current-to-voltage converter circuit, a buffer circuit of a differential output configuration that is inserted between the current-to-voltage converter circuit and the amplifier circuit, and a differentiating circuit that differentiates an inverted output from the buffer circuit and supplies it to a node having a high impedance in the other input signal line in the amplifier circuit.

In the current pulse receiving circuit according to the third aspect of the invention, the output signal from the current-to-voltage converter circuit as converted from an input current pulse to a corresponding voltage pulse is input to the amplifier circuit of the differential input configuration through the buffer circuit of the differential output configuration. The inverted output from the buffer circuit is then differentiated by the differentiating circuit and supplied to a high-impedance node in the other input signal line in the amplifier circuit.

The inverting signal of the pulse signal is thus differentiated and a signal having a steep differentiated waveform at a transition portion of the pulse signal is input to the other input signal line of the amplifier circuit. Since the node, in which the differentiated signal is input, has a high impedance, the differentiated signal is properly superimposed. This signal and the input pulse signal are input to the amplifier circuit, thus giving a hysteresis effect on the side emphasizing the pulse signal at the transition portion of the pulse signal.

Even if a current pulse with a rounded pulse transition portion is input, therefore, a differentiated waveform of the inverting signal serves as a hysteresis waveform, thus sufficiently providing hysteresis effects and producing a pulse output with a highly accurate pulse width.

If a light pulse of a small amplitude is input in an IrDA communications or other form of optical communications, and even if rounding occurs in a transition portion of a current pulse as a result of predominant output characteristics of a photodiode and the like, an output with an accurate pulse width can still be obtained.

The above and further objects and novel features of the invention will more fully appear from following detailed

DETAILED DESCRIPTION OF THE PREFERRED EMBODIMENTS

A first to a ninth embodiments of a current pulse receiving circuit according to this invention will hereinafter be described in detail with reference to the accompanying drawings.

Figure 1:
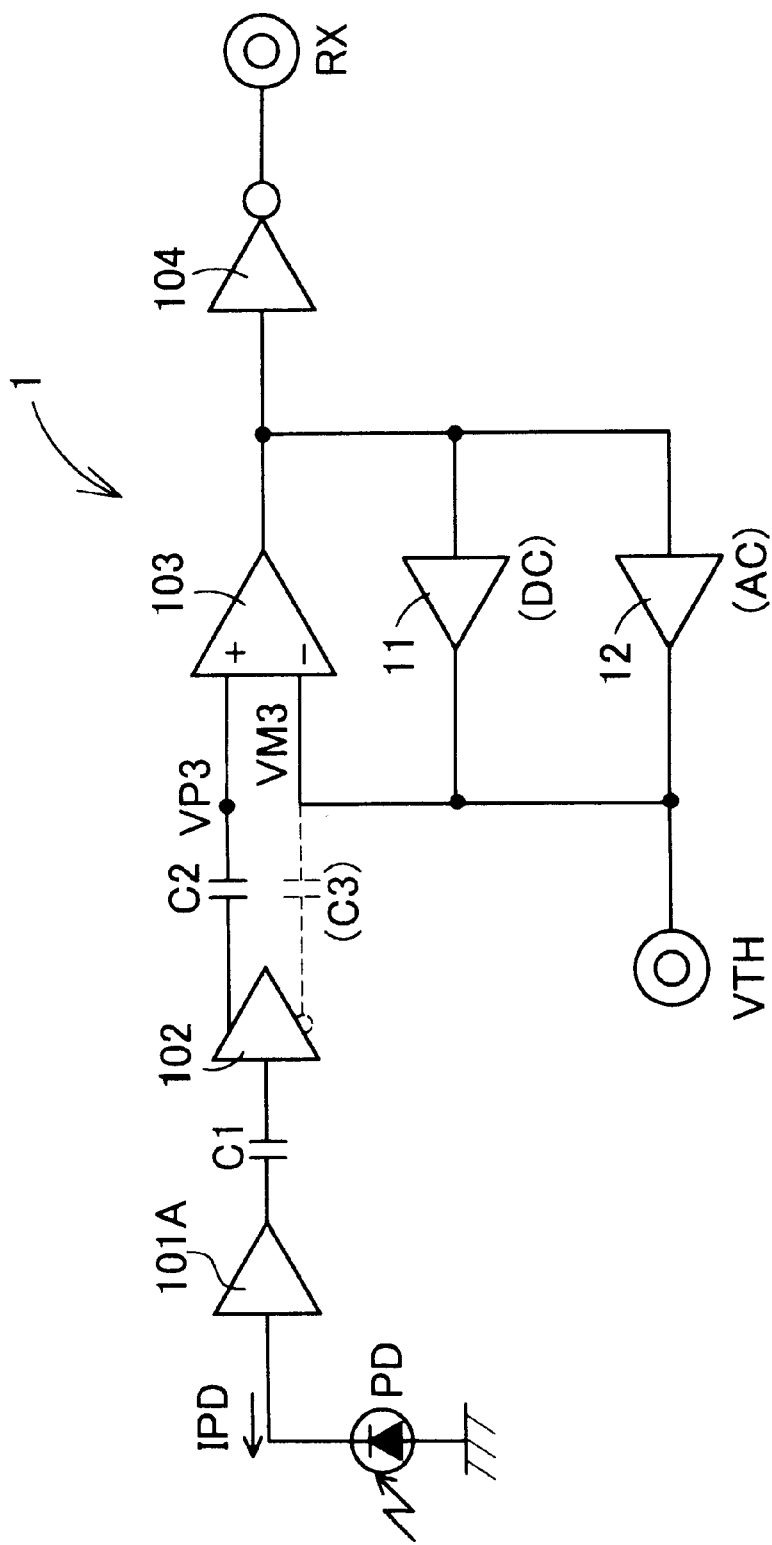
FIG. 1 is a circuit block diagram showing a current pulse receiving circuit according to a first embodiment.

The circuit block diagram of FIG. 1 showing a current pulse receiving circuit 1 according to a first embodiment shares the same basic construction as a first related art and a second related art, wherein an input light pulse is converted to a current pulse IPD by a photodiode PD and further converted to a corresponding voltage pulse by a current-to-voltage converter circuit 101A, the resultant voltage pulse is amplified by an amplifier circuit 102 and converted to a corresponding logic signal pulse by a comparator circuit 103, and the logic signal pulse is further inverted by an inverter 104 and a negative logic pulse is output from an output terminal RX. For convenience of explanation, FIG. 1 omits DC cancellation circuits 105A and 105B, and a DC feedback circuit 106. The circuit block diagram also shows a configuration in which capacitive coupling is made using a capacitive component Cl to connect the current-to-voltage converter circuit 101A and the amplifier circuit 102. Connection is nonetheless not limited to this method and, in actual circuit configurations, the first embodiment may be realized by using a single-layer direct connection (as in the first related art) or a differential capacitive coupling connection (as in the second related art) as described earlier with the related art. In addition, the connection between the amplifier circuit 102 and the comparator circuit 103 may be a single-layer capacitive coupling by means of a capacitive component C2 as shown in FIG. 1, or a differential capacitive coupling by adding a capacitive component C3 as shown by a dotted line in FIG. 1. A direct connecting without using a capacitive coupling may even be employed.

In the current pulse receiving circuit 1 according to the first embodiment, to apply a hysteresis voltage to a reference voltage signal VM3 with respect to an input signal VP3 to the comparator circuit 103, an AC hysteresis circuit 12, which can output a hysteresis voltage width that decreases with time from a predetermined initial amplitude, is added, in addition to a DC hysteresis circuit 11 that applies a DC hysteresis as a pulse is output from an output terminal of the comparator circuit 103.

Figure 2:
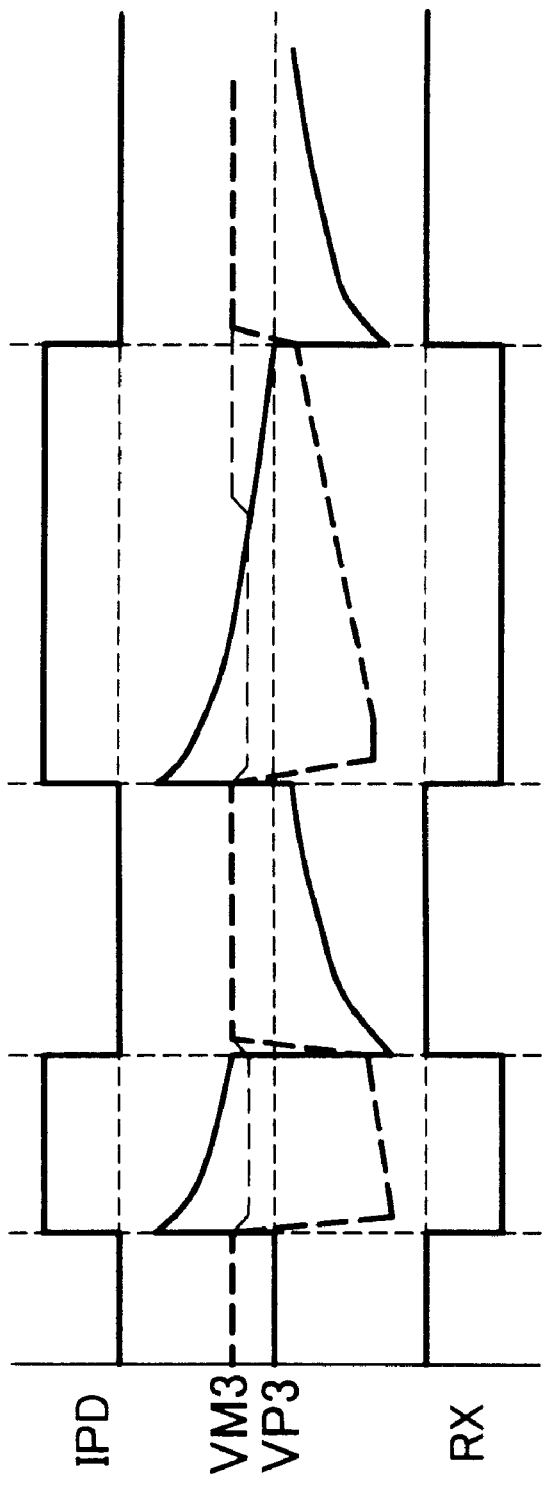
FIG. 2 shows input and output waveforms with a single input to a comparator circuit according to the first embodiment.
Figure 3:
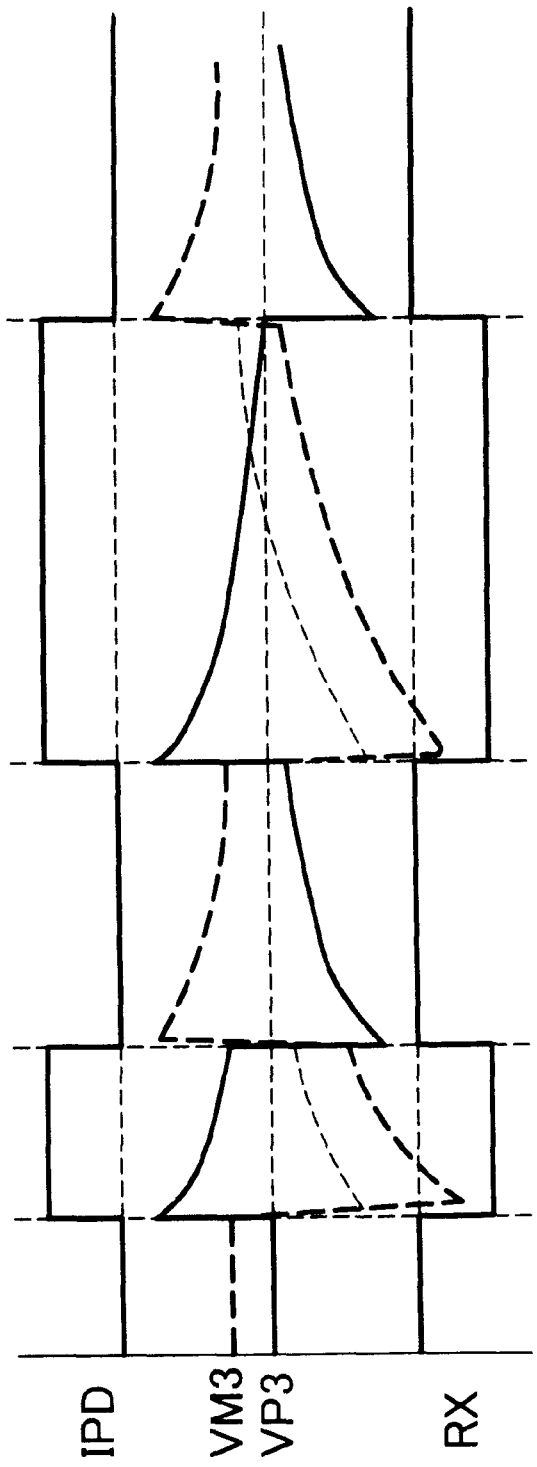
FIG. 3 shows input and output waveforms for a differential input to the comparator circuit according to the first embodiment.

FIGS. 2 and 3 show effects produced by these two hysteresis circuits 11 and 12 in a form of input/output response waveforms of the comparator circuit 103. FIG. 2 shows a case in which the input signal to the comparator circuit is a single input and the other input terminal is a terminal for a reference voltage fixed at a reference voltage VTH. As is evident from FIG. 2, when the current pulse IPD is output from the photodiode PD as a light pulse is being received, the voltage pulse fed from the current-to-voltage converter circuit 101A and amplified by the amplifier circuit 102 is applied to the input terminal VP3 of the comparator circuit 103, having been differentiated by the capacitive components C1 and C2 provided midway along the signal path. Simultaneously with this application of the pulse, a pulse signal is output to the output terminal of the comparator circuit 103 and further inverted by the inverter 104 to invert the output terminal RX to the negative side. At the same time, the DC and AC hysteresis circuits 11 and 12 are activated by the inversion of the output from the comparator circuit 103 to swing the voltage at the reference voltage terminal VM3 of the comparator circuit in the opposite direction, thus applying a hysteresis voltage across the input signals. The hysteresis voltage at this time is a voltage from the AC hysteresis circuit 12 superimposed on a voltage from the DC hysteresis circuit 12 having a fixed voltage width. The voltage at the reference voltage terminal VM3 therefore starts decreasing its width gradually with time immediately after the hysteresis voltage has been applied. With a short pulse, therefore, the pulse period ends while the hysteresis voltage width is in the middle of decreasing, and as the pulse width becomes longer, the residual hysteresis voltage width decreases at a trailing edge of the pulse. If a rate of decrease in the hysteresis voltage width by the AC hysteresis circuit 12 is set so that a hysteresis voltage width sufficient to prevent an erroneous output from the comparator circuit 103 is left at the trailing edge of a pulse with the longest pulse width, then the comparator circuit 103 can operate with a sufficient hysteresis voltage width throughout the entire pulse width.

FIG. 3 shows a case in which the input signal to the comparator circuit is a differential input. In this case, as well, connection of DC and AC hysteresis circuits 11 and 12 to the inverting input terminal VM3 will allow the comparator circuit 103 to operate with a sufficient hysteresis voltage width throughout the entire pulse width, as in the case of FIG. 2, if the hysteresis voltage width across the input signals in the comparator circuit 103 during pulse output is set to a level sufficient to prevent an erroneous output from being output.

Figure 4:
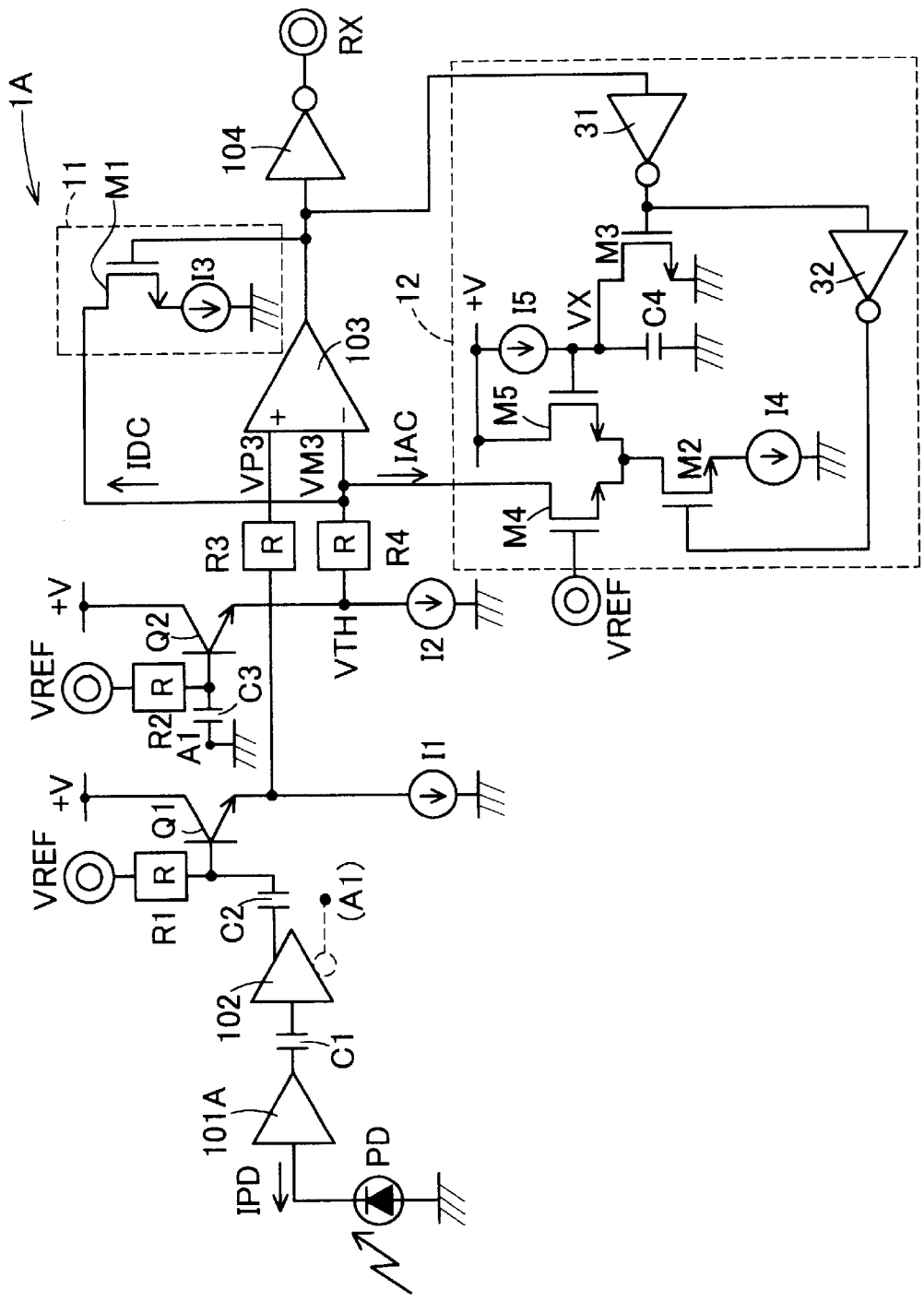
FIG. 4 is a circuit diagram showing a typical current pulse receiving circuit according to the first embodiment.

FIG. 4 shows a typical circuit according to the first embodiment. An output terminal of an amplifier circuit 102 is connected via a capacitive component C2 for capacitive coupling to a base terminal of an emitter-follower transistor Q1 that forms a buffer circuit. An emitter terminal of the emitter-follower transistor Q1 is connected to an input terminal VP3 of a comparator circuit 103 via a resistor component R3. A reference voltage side is, on the other hand, connected from an emitter terminal of an emitter-follower transistor Q2 that forms the same buffer circuit configuration as that on the input side to a reference voltage terminal VM3 of the comparator circuit 103 via a resistor component R4. A reference voltage, which is a reference voltage VREF minus a forward voltage developing across the base and emitter VBE, namely VREF−VBE, is being applied to the reference voltage terminal VM3 when there are no signals being applied. To achieve a balance with the input signal side, the base terminal of the emitter-follower transistor Q2 is connected to a resistor component R2 and a capacitive component C3 having the same configuration and the same size as a resistor component R1 and a capacitive component R2, respectively. The circuit example shown in FIG. 4 shows a case in which the amplifier circuit 102 is a single output which can, however, be modified to a differential output to achieve another configuration. To provide a differential output, an inverted output signal terminal A1 is connected to a terminal A1 of the capacitive component C3. FIG. 4 also shows the buffer circuits formed by NPN bipolar transistors Q1 and Q2. The configuration is not limited to this; alternatively, NMOS transistors may be used. Moreover, if the potential polarity is inverted, a configuration is also possible employing PNP bipolar transistors or PMOS transistors.

Hysteresis circuits are shown in the figure, denoted by reference numerals 11 and 12. A DC hysteresis circuit 11 is formed by a constant current source circuit I3 that is opened and closed by an NMOS transistor M1. The output terminal of the comparator circuit 103 is connected to a gate terminal of the NMOS transistor M1 which is turned ON when the output terminal is inverted to a positive polarity as a result of a pulse being input. When the transistor M1 is turned ON, the constant current source circuit I3 is connected to the reference voltage terminal VM3. Then, the constant current I3 as a current IDC flows from the emitter-follower transistor Q2 via the resistor component R4, which develops a voltage drop of R4×IDC at the resistor component R4, thus generating a hysteresis voltage. Since the current IDC is fixed at the constant current I3 while the output terminal of the comparator circuit 103 remains positive, the hysteresis voltage of R4×IDC is a DC voltage.

In an Ac hysteresis circuit 12, two NMOS transistors M4 and M5 form a current shunt circuit and an NMOS transistor M2 connects a constant current source circuit I4 to shunt a constant current I4. The NMOS transistor M4 is conducting, being provided with a predetermined ON resistance by the reference voltage VREF applied to a gate terminal thereof, and connects the constant current source circuit I4 to the reference voltage terminal VM3 of the comparator circuit 103. The NMOS transistor M5 is connected to a power source voltage +V. A capacitive component C4 is connected across a gate terminal VX and a ground potential and, at the same time, a constant current source circuit I5 as a charging path to the capacitive component C4 and an NMOS transistor M3 as a discharging path is connected to the gate terminal VX. The signal from the output terminal of the comparator circuit 103 is input to an inverter 31 and inverted to be input to the NMOS transistor M3, while it is inverted again by an inverter 32 to be input to the NMOS transistor M2.

When the output terminal of the comparator circuit 103 is inverted to a positive polarity, the output terminal of the inverter 31 is inverted to negative and the output terminal of the inverter 32 is inverted to positive. This turns OFF the NMOS transistor M3 and ON the NMOS transistor M2. In an initial state, the gate terminal VX is sufficiently discharged, the NMOS transistor M5 is OFF, and the constant current source I4 is connected to the shunt circuit. The constant current I4 flows as a current IAC through the resistor component R4 via the NMOS transistor M4, thus superimposing a hysteresis voltage of R4×IAC on the resistor component R4. Thereafter, the potential at the gate terminal VX gradually builds up as charging by a constant current I5 to the capacitive component C4 progresses, while the ON resistance of the NMOS transistor M5 gradually decreases. As a result, the constant I4 gradually shunts to the NMOS transistor M5 side, which gradually reduces the current IAC. When the voltage at the gate terminal VX eventually increases to the power source voltage +V, it causes the ON resistance of the NMOS transistor M5 to become smaller than the ON resistance of the NMOS transistor M4, thus allowing the constant current I4 to flow through the NMOS transistor M5. The hysteresis voltage of R4×IAC is therefore an AC voltage that gradually diminishes from R4×I4 to 0.

Figure 5:
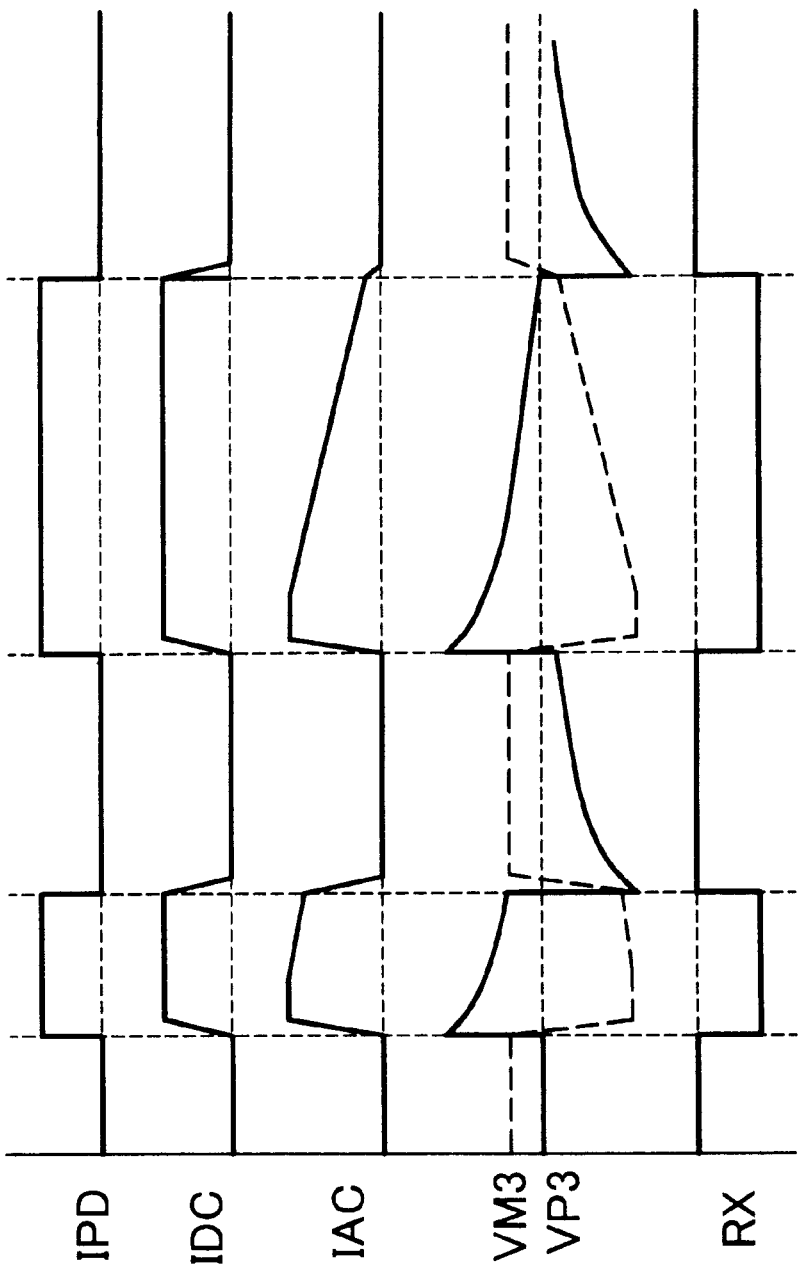
FIG. 5 shows input and output waveforms in the typical current pulse receiving circuit according to the first embodiment.

FIG. 5 shows input and output waveforms in the comparator circuit 103. As described with FIG. 2, since there is a sufficient hysteresis voltage width being given for both a short current pulse and a long current pulse, there is no chance of an erroneous pulse being produced in the comparator circuit 103, such that an accurate pulse width is output at the output terminal RX.

According to the current pulse receiving circuit 1 of the first embodiment, if a first predetermined width of the hysteresis voltage set by the first hysteresis circuit 11 and a second predetermined width and the rate of decrease with time set by the second hysteresis circuit 12 are set so as to provide a hysteresis voltage width sufficient for the maximum pulse width in a voltage pulse converted from the input current pulse IPD, it is possible to set a hysteresis voltage width sufficient for voltage pulses of all pulse widths. If the embodiment is applied to optical communications including IrDA communications, therefore, it is possible to stably set a hysteresis voltage width sufficient for preventing the comparator circuit 103 from producing an erroneous output even in the tail region by absorbing variations in the output characteristics of the photodiode PD that converts a light pulse to a corresponding current pulse IPD, as well as in tail characteristics in a differentiated waveform of the pulse signal, in addition to widely varying light pulse widths involved with the burst signals. In particular, a highly accurate output pulse width can be stably output over a pulse range of the longest pulse width as determined according to the settings of the second predetermined width and the rate of decrease with time made by the second hysteresis circuit 12. The receiving circuit is suitable for in optical communications including the IrDA communications, in which the longest input light pulse width is fixed.

While retaining the sum of the first predetermined width and the second predetermined width immediately after they have been set, the hysteresis voltage width gradually decreases with time and eventually diminishes to the first predetermined width. The problem, in which a set hysteresis voltage cannot be canceled and the output terminal is locked in a set position, can therefore be prevented by setting the first predetermined width to an amplitude of that less than a small-amplitude input signal.

The configuration given in the example shown in FIG. 4 is one in which the constant current I4 is shunted as time elapses to realize an AC hysteresis voltage. It is nonetheless possible to realize that by means of another method. In one possible configuration, for example, an output current value I4 of the constant current source circuit I4 decreases with time. This can be realized by employing a MOS transistor or other active resistor component for the resistor component for producing the constant current I4 in the constant current source circuit I4, thereby changing a control voltage for controlling the resistance value with time or decreasing the voltage value itself of the voltage source with time. It is also possible to increase the resistance value with time using a control voltage by inserting a MOS transistor or other active resistor component in the constant current I4 path. As still another arrangement, a MOS transistor or other active resistor component is used for the resistor component R4 to decrease the resistance value with time by means of a control voltage.

Figure 6:
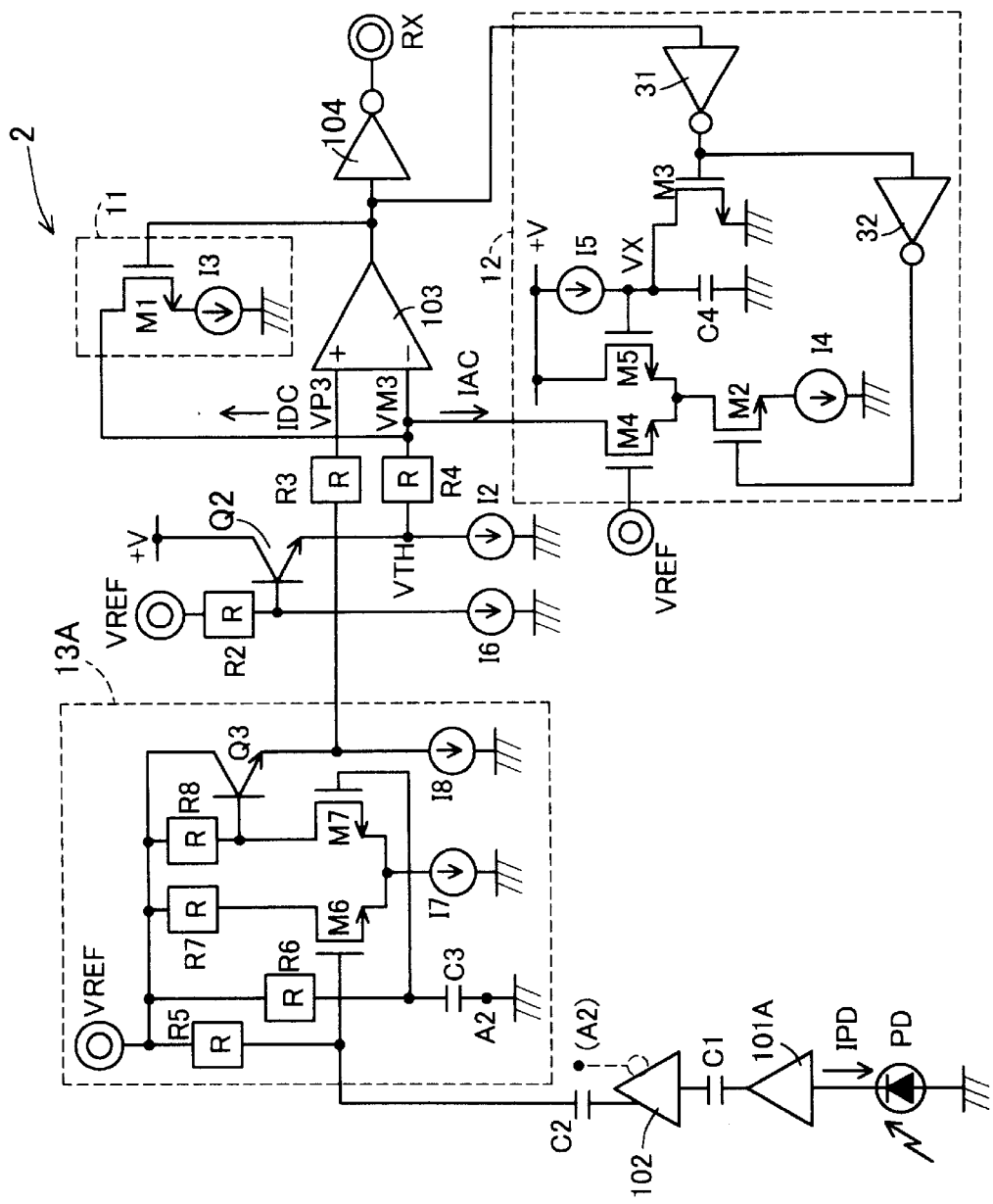
FIG. 6 is a circuit diagram showing a current pulse receiving circuit according to a second embodiment.

The circuit diagram of a current pulse receiving circuit 2 according to a second embodiment shown in FIG. 6 represents a configuration in which a voltage amplitude limiter circuit 13A that limits an output voltage amplitude of an amplifier circuit 102 is added to the current pulse receiving circuit 1 according to the first embodiment. The output signal from the amplifier circuit 102 is subjected to capacitive coupling through a capacitive component C2 and input to a gate terminal of an NMOS transistor M6. This gate terminal is DC-biased from a reference voltage VREF through a resistor component R5, wherein the resistor component R5 not only is for DC bias, but also functions to determine a cutoff frequency of low-band noises because of its configuration as a high-pass filter circuit in combination with the capacitive component C2.

The NMOS transistor M6 forms a differential amplifier pair with an NMOS transistor M7. Resistor components R7 and R8 are load resistances for transistors M6 and M7, respectively, being biased by a constant current source circuit I7. The reference voltage VREF is applied via a resistor component R6 to the gate terminal of the NMOS transistor M7. To achieve a balance with the gate terminal of the NMOS transistor M6, however, there is provided a capacitive component C3 between the gate terminal of the NMOS transistor M7 and a ground potential. The second embodiment gives an example of a single-output configuration from the amplifier circuit 102. A differential output configuration can still be formed by connecting an inverting output terminal A2 to a terminal A2 of the capacitive component C3.

The output from this differential amplifier pair is taken from a connection point between the NMOS transistor M7 and the load resistance R8 by an emitter-follower transistor Q3 biased by a constant current source circuit I8. The transistor Q3 and the constant current source circuit I8 are to replace the transistor Q1 and the constant current source circuit I1 in the first embodiment, being configured to achieve a circuit configuration balance with a transistor Q2 and a constant current source circuit I2 on the reference voltage side.

The output voltage from a voltage amplitude limiter circuit 13A when there are no signals available (which is the same as that developing at an input terminal VP3 by way of a resistor component R3) is as follows, since a half of the constant current I7 flows through a resistor component R8 because of a balanced differential amplifier pair.

*VP3=VREF−R8×I7/2−VBE*

When a pulse is input, a bias to the gate terminal of the transistor M6 becomes greater and an output voltage, which is determined by the input/output characteristics of the differential amplifier pair, is provided with the following as its maximum:

*VP3(MAX)=VREF−VBE*

At the end of a pulse, a bias to the gate terminal of the transistor M7 becomes greater and an output voltage is provided with the following as its minimum:

*VP3(MIN)=VREF−R8×I7−VBE*

Namely, the amplitude of the output voltage from the voltage amplitude limiter circuit 13A is as follows.

$$\Delta VP3 = VP3(MAX) - VP3(MIN) = R8 \times I7$$

An output signal having a wide dynamic range from the amplifier circuit 102 is therefore limited to a narrower voltage range of $\Delta VP3 = R8 \times I7$ due to the input/output characteristics of the differential amplifier pair. Any desired voltage amplitude can therefore be obtained by setting appropriately the values of the resistor component R8 (and R7 likewise) and the constant current I7.

Figure 7:
FIG. 7 shows input and output waveforms in the current pulse receiving circuit according to the second embodiment.

FIG. 7 shows input and output waveforms in a comparator circuit 103. Since the input signal amplitude at an input terminal VP3 is limited to a narrow amplitude range of $\Delta VP3 = R8 \times I7$, it is possible to ensure a constant hysteresis effect by DC and AC hysteresis circuits 11 and 12. Namely, a constant hysteresis effect can be obtained at all times in the input terminals VP3 and VM3 of the comparator circuit 103, thus allowing an accurate pulse width to be output from the output terminal RX, while eliminating a possibility of erroneous pulses occurring in the comparator circuit 103.

According to the current pulse receiving circuit 2 of the second embodiment, the voltage amplitude limiter circuit 13A limits the voltage amplitude of a large amplitude signal from current-to-voltage converter portions 101A and 102 to compress a voltage amplitude difference from a small amplitude signal, thus limiting a range of input signals to the comparator circuit 103. This enables maintaining a hysteresis effect produced by a hysteresis voltage width which is a fixed value set by the first predetermined width set by the first hysteresis circuit 11 and the second predetermined width set by the second hysteresis circuit 12. Namely, a hysteresis effect can be given reliably and effectively to all signals covering from a small-amplitude signal to a large-amplitude signal. Moreover, differences in tail characteristics in input signals are absorbed to prevent an erroneous output from occurring in the comparator circuit 103 even in the tail region and a stabilized accurate pulse width can be output.

In addition, since the range of input signals to the comparator circuit 103 is limited, an effective hysteresis effect can be given to even a voltage pulse with a longer pulse width from the same hysteresis characteristics setting.

Figure 8:
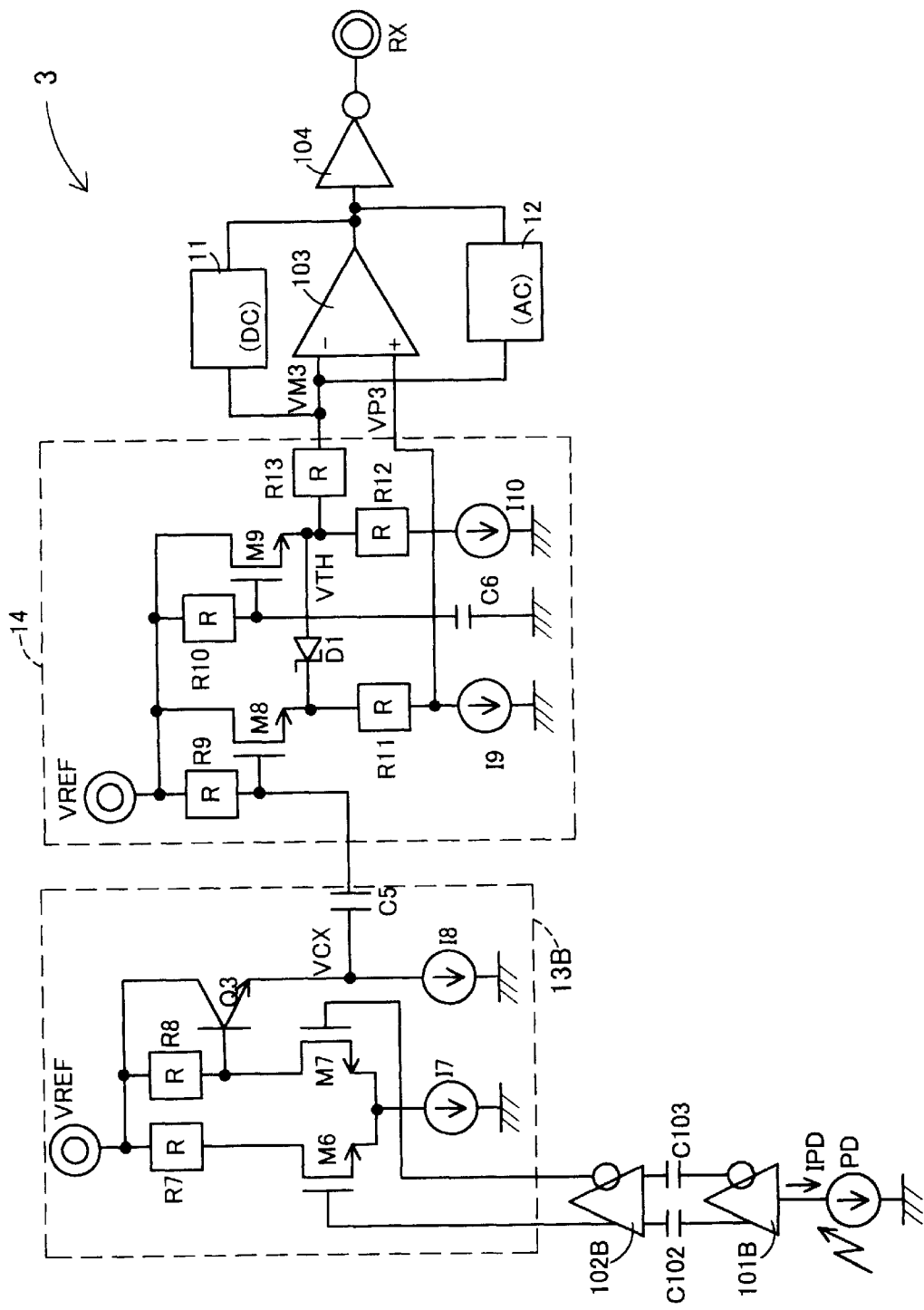
FIG. 8 is a circuit diagram showing a current pulse receiving circuit according to a third embodiment.

The circuit diagram of a current pulse receiving circuit 3 according to a third embodiment shown in FIG. 8 represents a configuration in which a buffer circuit having an offset setting function 14 is added to the current pulse receiving circuit 2 according to the second embodiment. In the third embodiment, an amplifier circuit 102B is directly connected to a voltage amplitude limiter circuit 13B and a capacitive component for capacitive coupling C5 is provided between the voltage amplitude limiter circuit 13B and the buffer circuit having an offset setting function 14.

The buffer circuit having an offset setting function 14 is provided in place of the transistor Q1, the constant current source circuit I1, the transistor Q2 and the constant current source circuit I2 (see FIG. 4) that supply, as a buffer circuit, the comparator circuit 103 with an input signal and a reference voltage in the first embodiment.

The signal from the capacitive component C5 is input to a gate terminal of a source-follower transistor M8. This gate terminal is DC-biased from a reference voltage VREF through a resistor component R9. The resistor component R9 not only is for DC bias, but also functions to determine a cutoff frequency of low-band noises because of its configuration as a high-pass filter circuit in combination with the capacitive component C5.

A source terminal of the transistor M8 is connected to a cathode terminal of a Schottky diode D1 and, at the same time, connected to a constant current source circuit I9 through a resistor component R11. A connection point between the resistor component R11 and the constant current source circuit I9 is an input terminal VP3 of a comparator circuit 103. An anode terminal of the Schottky diode D1 is connected to a reference voltage terminal VM3 of the comparator circuit 103 through a resistor component R13. In addition, a source-follower transistor M9, a resistor component R12, and a constant current source circuit I10 are formed as a reference voltage VTH setting circuit to achieve a circuit balance with the transistor M8, the resistor component R11, and the constant current source circuit I9 on the input signal side. Moreover, a gate terminal of the transistor M9 is formed by a resistor component R10 and a capacitive component C6 to achieve a balance with the gate terminal of the transistor M8.

The transistor M8 side is balanced with the M9 side in a steady state such that the voltage at each of the corresponding terminals of the two sides becomes the same. Hence, there is no current flowing through the Schottky diode D1. The terminal voltage at the resistor component R11 as the connection point with the transistor M8 is therefore equivalent to that at the reference voltage terminal VM3 of the comparator circuit 103. Since the other terminal of the resistor component R11 is the input terminal VP3 of the comparator circuit 103, a voltage drop of R11×I9 occurring as a result of the constant current I9 flowing through the resistor component R11 is applied as an offset voltage in the comparator circuit 103 so as to turn OFF the output voltage. Any desired offset voltage amplitude could be obtained by appropriately setting the values for the resistor component R11 and the constant current I9. It is also possible to provide an arrangement enabling a resistance value and a current value to be adjusted from outside. Moreover, in place of a resistor component as a passive component, a MOS transistor or other active component may be used for the resistor component R11. A configuration can even be employed that generates a required voltage, such as a diode.

Though the third embodiment uses a differential output for the output from the amplifier circuit 102B, a single-output configuration can still be employed, wherein a fixed voltage is input as a reference voltage to the other terminal in a differential amplifier pair of the voltage amplitude limiter circuit 13B.

A configuration of a differential output type is also possible if the same buffer circuit as that for the transistor Q3 is connected to a load resistance R7 side of the voltage amplitude limiter circuit 13B and to a ground potential side terminal of the capacitive component C6.

A still another configuration is possible, in which the voltage amplitude limiter circuit 13B is omitted and the output from the amplifier circuit 102B is directly connected through a capacitive component to the buffer circuit having an offset setting function 14.

According to the current pulse receiving circuit 3 of the third embodiment, because the offset value for the input signal to the comparator circuit 103 can be set to any desired value, it is possible to set an optimum offset value according to the pulse width, voltage amplitude, and tail characteristics of the input signal, and noise environment and other factors. This permits a stable output of accurate pulse widths with no malfunctions.

In addition, if an arrangement is provided that allows the offset setting of the buffer circuit having an offset setting function 14 to be adjusted from the outside, it is possible to appropriately vary the offset value in accordance with the operating environment, thus realizing an even more stabilized current pulse receiving circuit 3.

Figure 9:
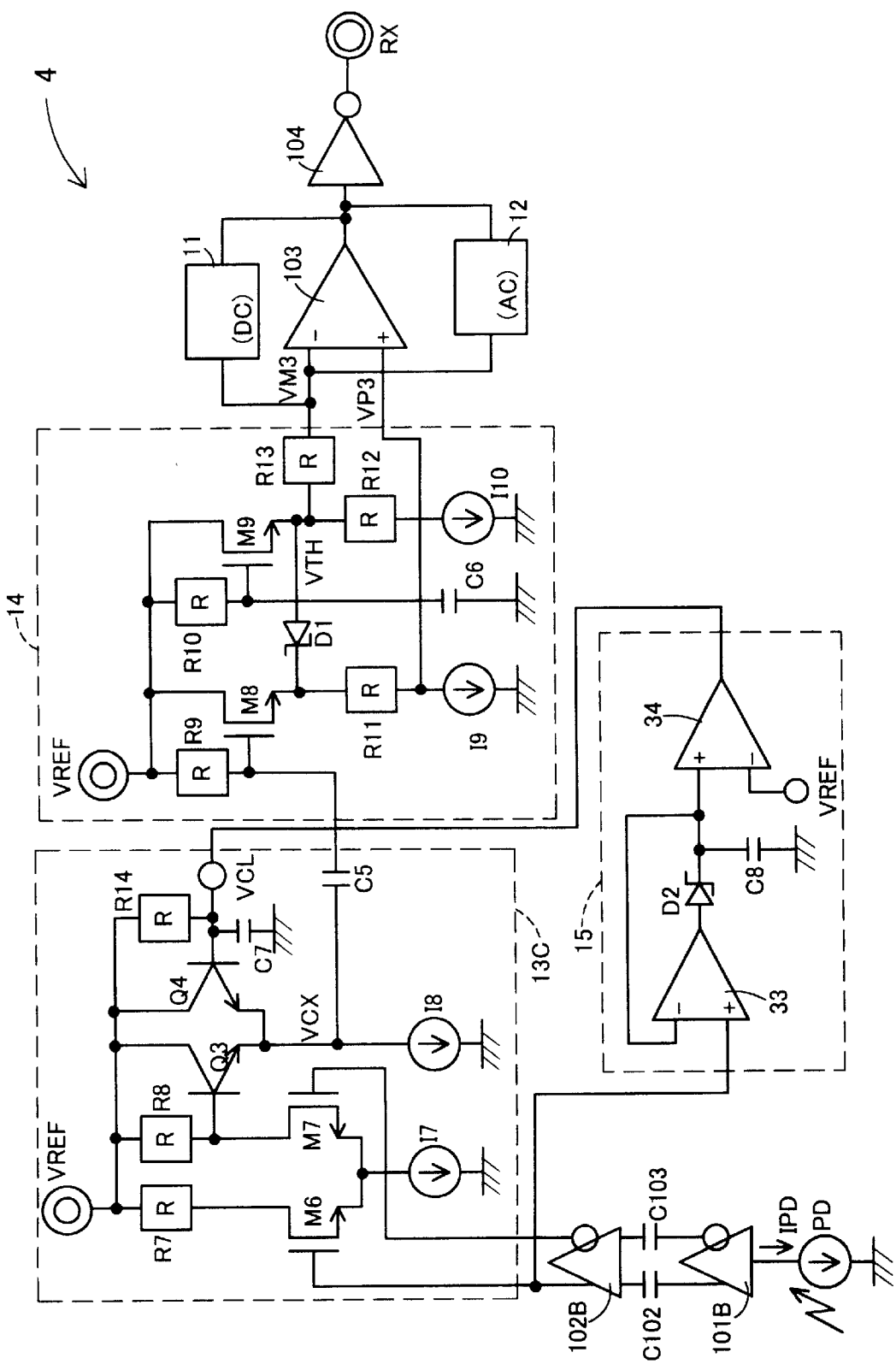
FIG. 9 is a circuit diagram showing a current pulse receiving circuit according to a fourth embodiment.

The circuit diagram of a current pulse receiving circuit 4 according to a fourth embodiment shown in FIG. 9 represents a configuration in which a peak hold circuit 15 is added to the current pulse receiving circuit 3 according to the third embodiment, while in place of the voltage amplitude limiter circuit 13B used in the current pulse receiving circuit 3, a voltage amplitude limiter circuit 13C is provided that includes a low potential level boost function that, if the output voltage from the peak hold circuit 15 becomes a predetermined voltage value or greater, increases the output voltage on a low potential side of the voltage amplitude limiter circuit 13B by an amount of voltage equivalent to the amount exceeding the predetermined voltage value.

The peak hold circuit 15 holds the output voltage on a high potential side of the output signal from the amplifier circuit 102B. A voltage follower circuit is formed by providing a feedback connection from the output of an amplifier 33 to a negative side input terminal of the amplifier 33 through a Schottky diode D2 that is connected in a forward direction, thereby charging a capacitive component C8 with the output voltage. When the input voltage lowers, the capacitive component C8 is discharged with a reverse-direction current of the Schottky diode D2, which elongates a time constant, thus allowing a peak voltage to be effectively held. The held peak voltage undergoes buffering by a buffer circuit 34 before being input to a base terminal VCL of an emitter-follower transistor Q4.

An emitter terminal of the transistor Q4 is connected to the output terminal VCX of the voltage amplitude limiter circuit 13B of the third embodiment. A resistor component R14 for determining a DC bias point is connected across the base terminal VCL of the transistor Q4 and the reference voltage VREF and a capacitive component C7 is connected across the base terminal VCL of the transistor Q4 and the ground potential. The capacitive component C7 is for noise removal.

Figure 10:
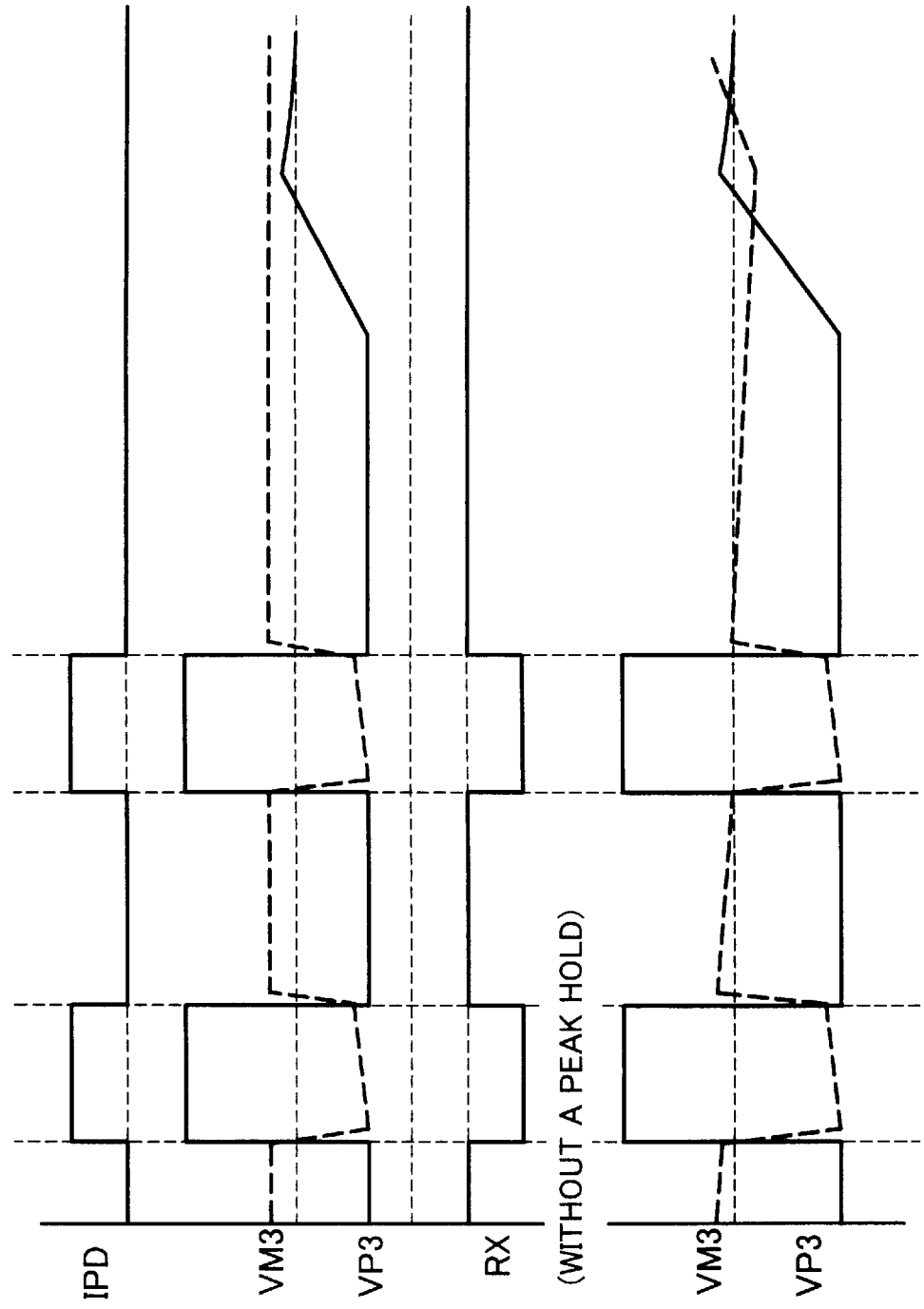
FIG. 10 shows input and output waveforms in the current pulse receiving circuit according to the fourth embodiment.

Circuit operation will now be described referring to FIG. 10. FIG. 10 shows input and output waveforms in a comparator circuit 103 according to the fourth embodiment. The baseline potential of a reference voltage terminal VM3 of the comparator circuit 103 is connected to a source terminal of a transistor M8 through a Schottky diode D1, coinciding with the baseline potential of this terminal. The baseline potential of this terminal is the average of the gate terminal voltage of the transistor M8 that is a capacitive coupling from the voltage amplitude limiter circuit 13C through a capacitive component C5, since the transistor M8 forms a source-follower connection with a constant current I9 flowing as a source current thereof. When the duty ratio of a positive pulse of the output signal from the voltage amplitude limiter circuit 13C is low with no peak hold circuit provided, then the potential at the reference voltage terminal VM3 gradually lowers for each cycle pulse as shown in the lower part of FIG. 10. This trend is prominent when the output signal from the voltage amplitude limiter circuit 13C operates with a large amplitude. If an overshoot occurs in a signal at an input terminal VP3 when the potential at the reference voltage terminal VM3, which has been lowered by a large-amplitude burst signal, is restored to a condition in which there are no signals present after the completion of signal reception, the potential relationship with respect to the dropped reference voltage terminal VM3 could be inverted, thus producing an output of an erroneous pulse.

The peak voltage of the output signal from the amplifier circuit 102B is therefore held by adding the peak hold circuit 15. When a large-amplitude signal is input and a voltage value to be held exceeds VREF−R8×I7, which is the output voltage on the low potential side of the voltage amplitude limiter circuit 13C, by VBE or more, the output voltage at the output terminal VCX of the voltage amplitude limiter circuit 13C ranges between VCL−VBE on the low voltage side and VRE−VBE on the high voltage side with VREF−R8×I7/2−VBE being the central value. Namely, while the output period becomes longer with a small voltage amplitude on the low voltage side, the output period is short with the voltage amplitude remaining unchanged on the high voltage side, thus balancing the average of the signal voltage value. This helps control the voltage drop at the reference voltage terminal VM3, eliminating the possibility of the output of an erroneous pulse even when an overshoot occurs at the input terminal VP3 at the end of signal reception.

The same benefits can be derived when an integrating circuit is used instead of the peak hold circuit 15. When a burst signal is input, the pulse signal is integrated and when the output voltage from the integrating circuit exceeds a predetermined voltage, the same operation as described in the foregoing can be performed. If the operation is performed when there is a voltage drop at the reference voltage terminal VM3 of the comparator circuit 103, which results from a burst signal extending over a predetermined period of time or more, it helps control the voltage drop at the reference voltage terminal VM3, which eliminates the possibility of the output of an erroneous pulse even if an overshoot occurs at the input terminal VP3 at the end of signal reception.

The integrating circuit can be achieved by replacing the Schottky diode D2 with a resistor component in the peak hold circuit 15.

According to the current pulse receiving circuit 4 of the fourth embodiment, with the voltage amplitude limiter circuit 13C, a hysteresis effect can be given both reliably and effectively to all signals covering from a small-amplitude signal to a large-amplitude signal. Moreover, differences in tail characteristics in input signals are absorbed to prevent an erroneous output from occurring in the comparator circuit 103 even in the tail region and a stabilized accurate pulse width can be output. In addition, the occurrence of an erroneous pulse can be prevented at the end of signal reception, ensuring a stabilized output of an accurate pulse width.

Figure 11:
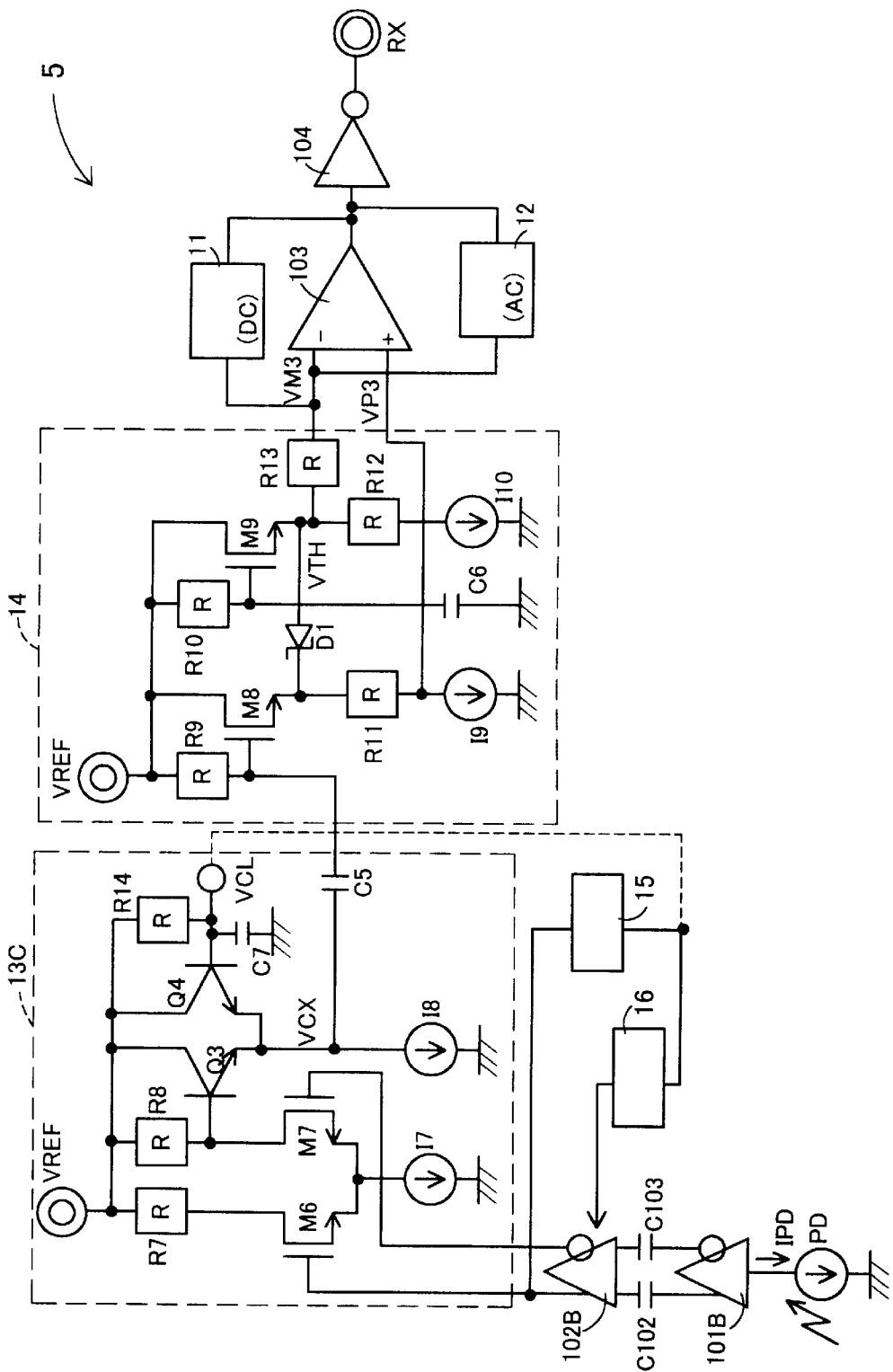
FIG. 11 is a circuit diagram showing a current pulse receiving circuit according to a fifth embodiment.

The circuit diagram of a current pulse receiving circuit 5 according to a fifth embodiment shown in FIG. 11 represents a configuration in which a peak hold circuit 15 and an automatic gain adjustment circuit 16 are added to the current pulse receiving circuit 3 of the third embodiment. Another possible configuration is provided with a voltage amplitude limiter circuit 13C used in combination with the peak hold circuit 15, in place of the voltage amplitude limiter circuit 13B, so as to obtain the same benefits as those of the fourth embodiment.

Figure 12:
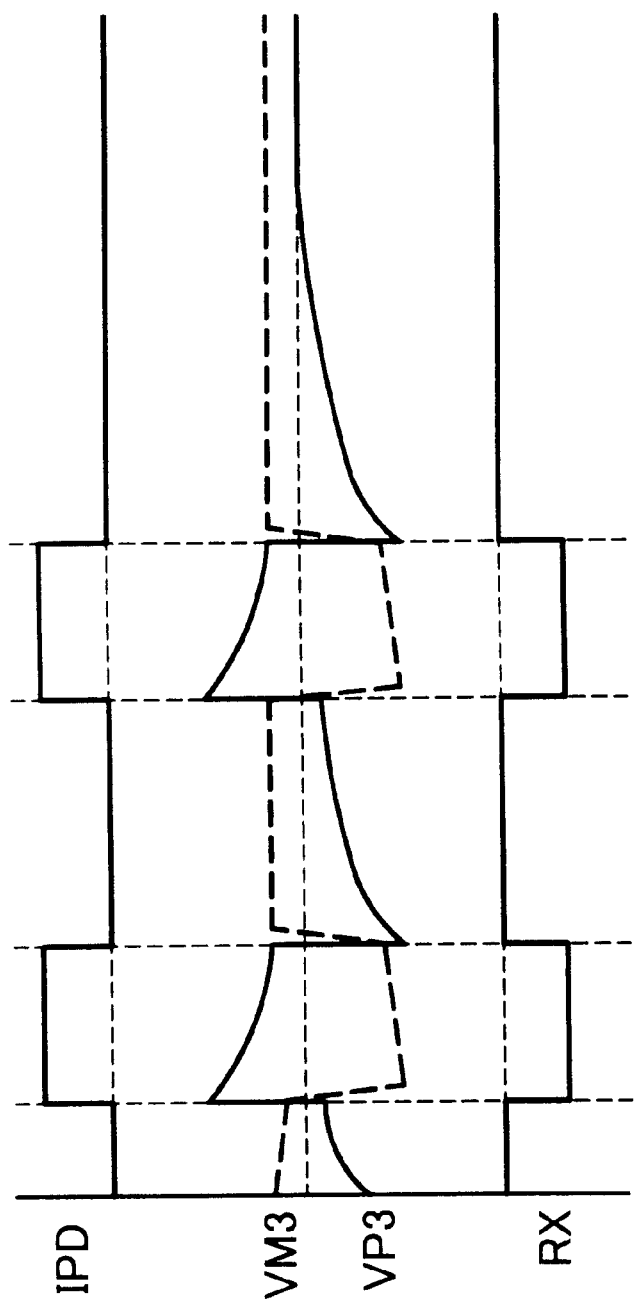
FIG. 12 shows input and output waveforms in the current pulse receiving circuit according to the fifth embodiment.

According to the fifth embodiment and referring to FIG. 12, when the output voltage from the peak hold circuit 15 described in the fourth embodiment is a predetermined voltage value or greater, the automatic gain adjustment circuit 16 is activated to adjust gain in the amplifier circuit 102B so as to keep the amplitude of an output signal from the amplifier circuit 102B small. This allows the amplitude of an output signal from the voltage amplitude limiter circuit 13C to be kept small, thus preventing a baseband potential that develops at the reference voltage terminal VM3 as an average voltage of pulse waveforms from dropping. This eliminates the possibility of the output of an erroneous pulse even if an overshoot occurs at the input terminal VP3 at the end of signal reception.

The benefit derived from the fourth embodiment can also be obtained if the output signal from the peak hold circuit 15 is input also to a terminal VCL of the voltage amplitude limiter circuit 13C.

If the benefit derived from the fourth embodiment is not necessary, a configuration is possible providing the voltage amplitude limiter circuit 13B instead of the voltage amplitude limiter circuit 13C.

It is not necessary to provide the voltage amplitude limiter circuits 13B and 13C as long as the automatic gain adjustment circuit 16 is capable of sufficiently adjusting the gain in the amplifier circuit 102B to eliminate large-amplitude operations.

In the fifth embodiment, the automatic gain adjustment circuit 16 is activated to adjust gain in the amplifier circuit 102B. The same benefit can also be derived by replacing the automatic gain adjustment circuit 16 with an automatic resistivity adjustment circuit so as to adjust current-to-voltage conversion resistance of the current-to-voltage converter circuit 101B.

The same benefit can also be derived as in the fourth embodiment if the peak hold circuit 15 is replaced with an integrating circuit.

According to the current pulse receiving circuit 5 of the fifth embodiment, there is almost no voltage drop occurring in the baseband potential of the input signal of the comparator circuit 103 which undergoes capacitive coupling even in IrDA communications involving a positive pulse with a low duty ratio. Moreover, since the voltage amplitude of the signal is reduced to an amplitude level of a small-amplitude signal, an overshoot or other momentary change does not occur in the input signal of the comparator circuit 103 even when the potential is restored to a condition in which there are no signals present at the end of a burst signal. This eliminates the possibility of the comparator circuit 103 producing an output of an erroneous pulse after the completion of reception of a burst signal, and a hysteresis effect can be given both reliably and effectively to all input current pulses covering from a small-amplitude pulse to a large-amplitude pulse. Furthermore, differences in tail characteristics in input signals are absorbed to prevent an erroneous output from occurring in the comparator circuit 103 even in the tail region and a stabilized accurate pulse width can be output. In addition, the occurrence of an erroneous pulse can be prevented at the end of signal reception, ensuring stabilized output of an accurate pulse width.

Figure 13:
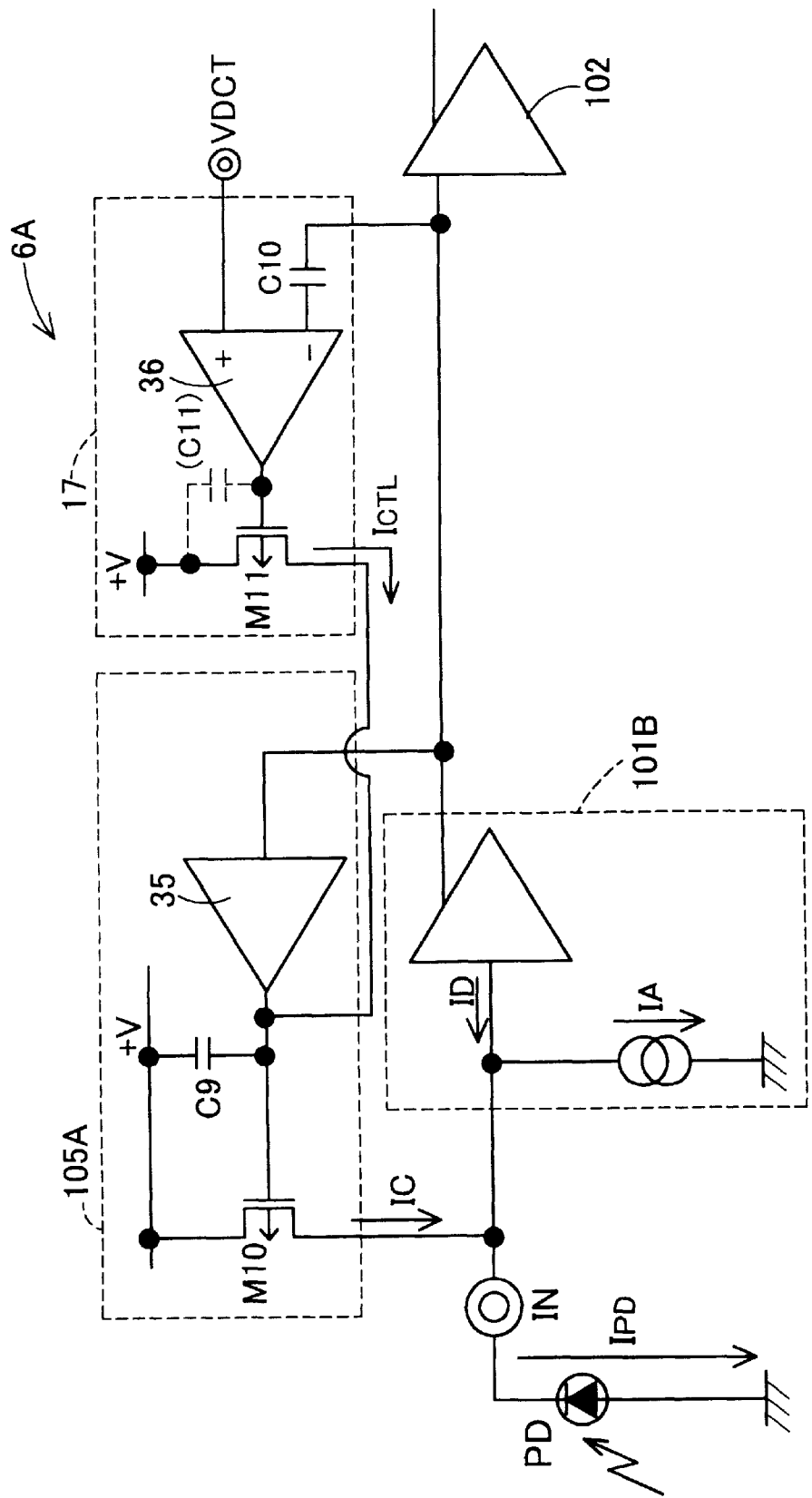
FIG. 13 is a circuit diagram showing essential portions of a first example of a current pulse receiving circuit according to a sixth embodiment.

The circuit diagram 6A showing essential portions of a current pulse receiving circuit of a first example according to a sixth embodiment shown in FIG. 13 represents a portion having a current-to-voltage converter circuit 101B that converts an input current IPD converted by a photodiode PD to a corresponding voltage signal, an amplifier circuit 102 that receives the converted voltage signal, and a DC cancellation circuit 105A that is provided between the two circuits 101B and 102 and that detects a DC voltage level of the converted voltage signal and feeds back a current IC to the input terminal IN of the current-to-voltage converter circuit 101B, thereby canceling a DC-level offset. In addition to these, there is provided a large signal detection circuit 17.

In the current pulse receiving circuit of the first example according to the sixth embodiment, both the DC cancellation circuit 105A that inputs a positive output signal from the current-to-voltage converter circuit 101B and the large signal detection circuit 17 are of a single input configuration, with the other input terminal functioning as a reference voltage terminal to which a fixed predetermined reference voltage is applied (DC cancellation circuit 105A is not shown). When the large signal detection circuit 17 detects that an output signal from the current-to-voltage converter circuit 101B has a large amplitude, the amount of offset cancellation of the DC cancellation circuit 105A is decreased, which decreases a current-to-voltage conversion resistance in the current-to-voltage converter circuit 101B, thereby limiting the amplitude of the output signal from the current-to-voltage converter circuit 101B.

Figure 14:
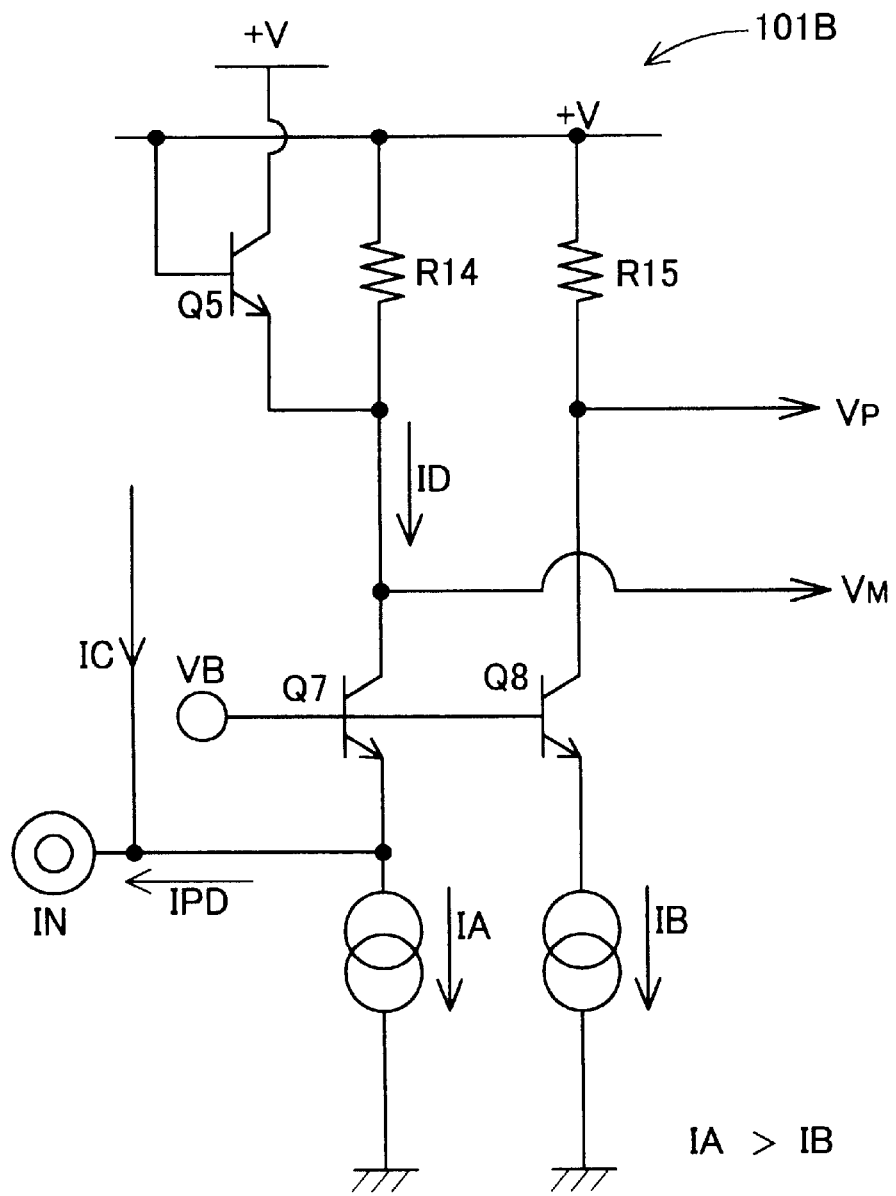
FIG. 14 is a circuit diagram showing a typical current-to-voltage converter circuit.

Referring to FIG. 14 which shows a typical current-to-voltage converter circuit 101B, a pair of constant current source circuits IA and IB is connected to resistor components R14 and R15 which form a current-to-voltage converter portion through transistors Q7 and Q8 whose base terminals are biased with a voltage VB. The transistors Q7 and Q8 not only fix voltages applied to the constant current source circuits IA and IB at VB−VBE to enhance the accuracy of the output current value of the pair of constant current source circuits IA and IB, but also lower an input impedance to increase frequency characteristics. The other ends of resistor components R14 and R15 are connected to a power source voltage +V and a difference in a voltage drop that develops at the resistor components R14 and R15 due to a difference in current flowing through the resistor components R14 and R15 is output from output terminals VP and VM as a differential voltage output. Alternatively, a differential voltage output can likewise be provided from the output terminals VP and VM when a collector terminal of a clamp transistor Q5 is connected to the power source voltage +V and the other ends of the resistor components R14 and R15 are connected to a voltage source +V provided separately from the power source voltage +V which is regulated to a constant voltage by a regulator inside an integrated circuit.

In the first example of the sixth embodiment, if the input current IPD is a small signal pulse, it is necessary to cancel an input current IPD (DC) representing DC disturbance light such as sunlight that is input in a form other than a pulse signal and output by the photodiode PD. To achieve this end, a current IC is input from the DC cancellation circuit 105A to the input terminal IN of the current-to-voltage converter circuit 101B. In the current-to-voltage converter circuit 101B, current outputs from the pair of constant current source circuits IA and IB are fixed to IA>IB. A DC disturbance component IPD (DC) is canceled with the current IC from the DC cancellation circuit 105A, thus achieving a balance with the other constant current IB. Namely:

$$IB=IA+IPD\ (DC)-IC=ID$$

With a small signal amplitude, the current ID flows through the resistor component R14 and there is no chance of its flowing through the clamp transistor Q5 connected in parallel. Therefore, current flowing through the resistor components R14 and R15 in the current-to-voltage converter portion become equal and the output terminals VP and VM are balanced to cancel a DC offset.

The current IC at this time is output when the amplifier 35, which detects that an offset is included in the output signal from the current-to-voltage converter circuit 101B, controls a gate terminal of a PMOS transistor M10 used for setting the current value of the current IC. A capacitive component C9 is connected to the gate terminal of the transistor M10 to set a predetermined time constant so that the transistor operates on a frequency sufficiently lower than the frequency of an intended input signal of the current-to-voltage converter circuit 101B.

If the input current IPD is a large amplitude pulse, the output signal from the current-to-voltage converter circuit 101B becomes a large amplitude signal. When this signal is recognized as an authentic input signal pulse by a capacitive component C10 for capacitive coupling and a voltage amplitude value thereof exceeds a predetermined voltage VDCT, then a gate terminal of a PMOS transistor M11 is controlled through an amplifier 36 and a control current ICTL for limiting the voltage amplitude is output to the gate terminal of the PMOS transistor M10 for current IC output of the DC cancellation circuit 105A. The control current ICTL increases the gate terminal voltage of the PMOS transistor M10 with time by letting the capacitive component C9, which sets a time constant for the DC cancellation circuit 105A, discharge, thereby decreasing the current IC for DC cancellation with a predetermined time constant. As a result, the balance of IB=ID with a small signal collapses to set ID>IB. The current ID at this time makes the clamp transistor Q5 conductive. VBE of the transistor Q5 is given by the following equation when the emitter current of the transistor Q5 is smaller than the current flowing through the resistor component R14:

$$\Delta VBE = R14 \times \Delta ID$$

When the emitter current of the transistor Q5 is greater than the current flowing through the resistor component R14, then it is given by the following equation:

$$\Delta VBE = VT \times LN(\Delta ID/IS)$$

The change in whether the input current pulse IPD is available or not is given as a potential difference $\Delta VBE$ of the clamp transistor Q5 with logarithmic characteristics through $\Delta ID$. Namely, since the current-to-voltage conversion resistance becomes in parallel with the resistor component R14 and the emitter resistance of the clamp transistor Q5 having a small resistance value, the current-to-voltage conversion resistance decreases and the output voltage amplitude is limited.

Figure 15:
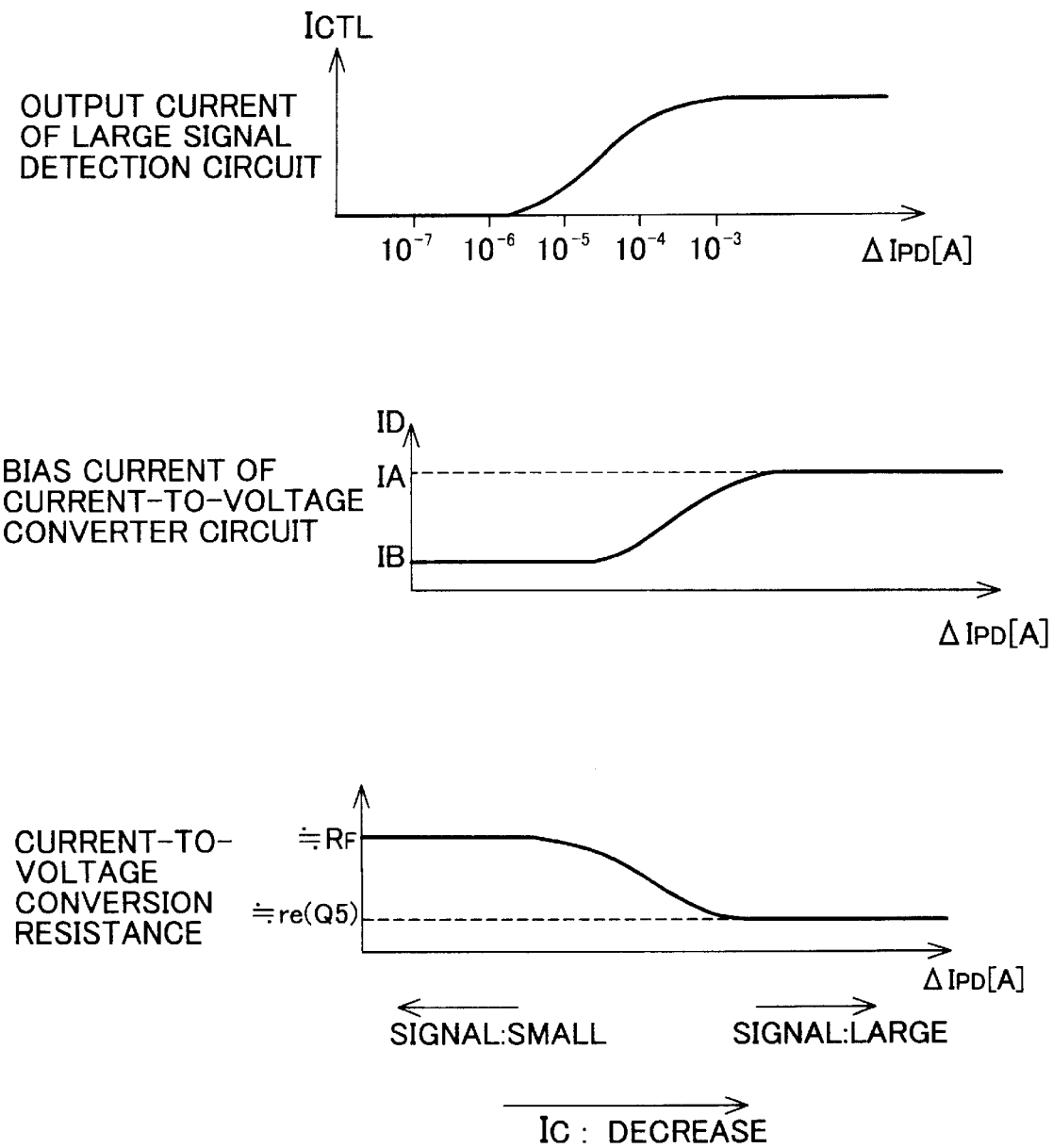
FIG. 15 shows waveforms representing a relationship between characteristics of a large signal detection circuit and a current-to-voltage converter circuit in the current pulse receiving circuit according to the sixth embodiment.

FIG. 15 shows changes in the current ID of the current-to-voltage converter circuit 101B and the current-to-voltage conversion resistance with respect to the output current ICTL of the large signal detection circuit 17. It depicts the following relationship. Namely, when the output current ICTL increases as a result of a large amplitude operation ($\Delta IPD$: large), the current ID increases to make the clamp transistor Q5 conductive with the resultant emitter resistance becoming dominant in place of the resistor component R14, which decreases the current-to-voltage conversion resistance.

Figure 16:
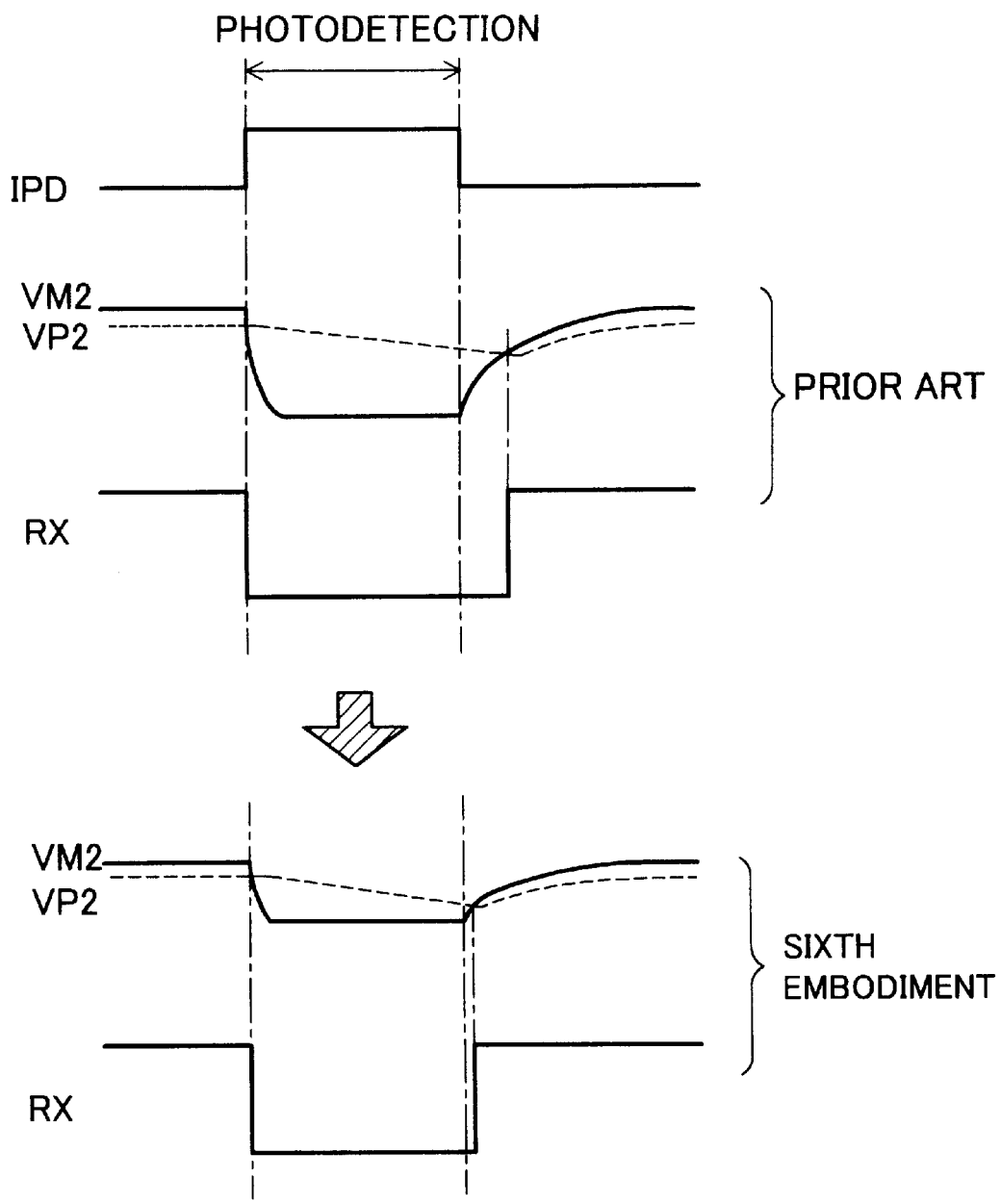
FIG. 16 shows input and output waveforms of the first example of the current pulse receiving circuit according to the sixth embodiment.
Figure 30:
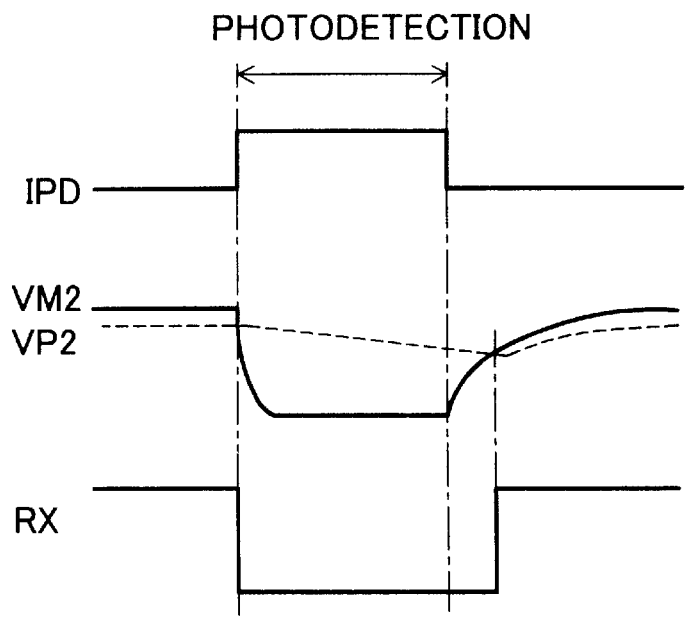
FIG. 30 shows input and output response waveforms of an amplifier circuit under a high intensity in the light pulse receiving circuit according to the first related art.
Figure 31:
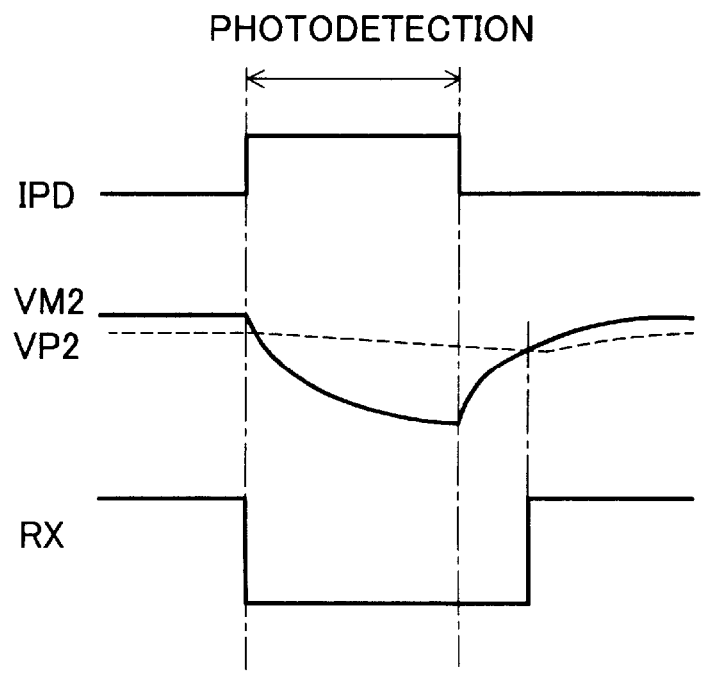
FIG. 31 shows input and output response waveforms of the amplifier circuit under a low intensity in the light pulse receiving circuit according to the first related art.
Figure 32:
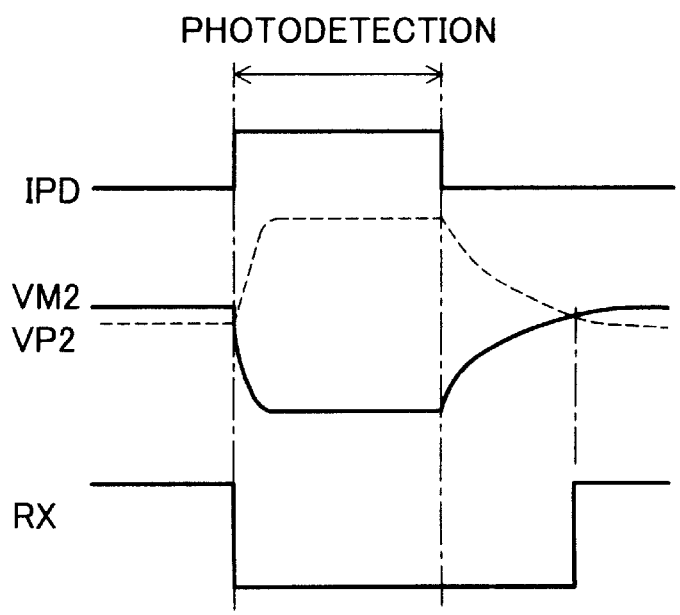
FIG. 32 shows input and output response waveforms of an amplifier circuit under a high intensity in the light pulse receiving circuit according to the second related art.

FIG. 16 shows improvements made on the first related art, as embodied in the first example of the sixth embodiment. The upper waveforms of FIG. 16 represent response waveforms of the amplifier circuit 102A in the first related art (see FIG. 30). Because the pulse waveform VM2 has a large amplitude, tail characteristics are prominent at the trailing edge of the pulse, making the pulse width large at the output terminal RX. In the first example of the sixth embodiment shown in the lower waveforms of FIG. 16, since the amplitude of the input signal VM2 at the amplifier circuit 102 is limited, tail characteristics are small at the trailing edge of the pulse, allowing the output of an accurate pulse width at the output terminal RX.

Figure 17:
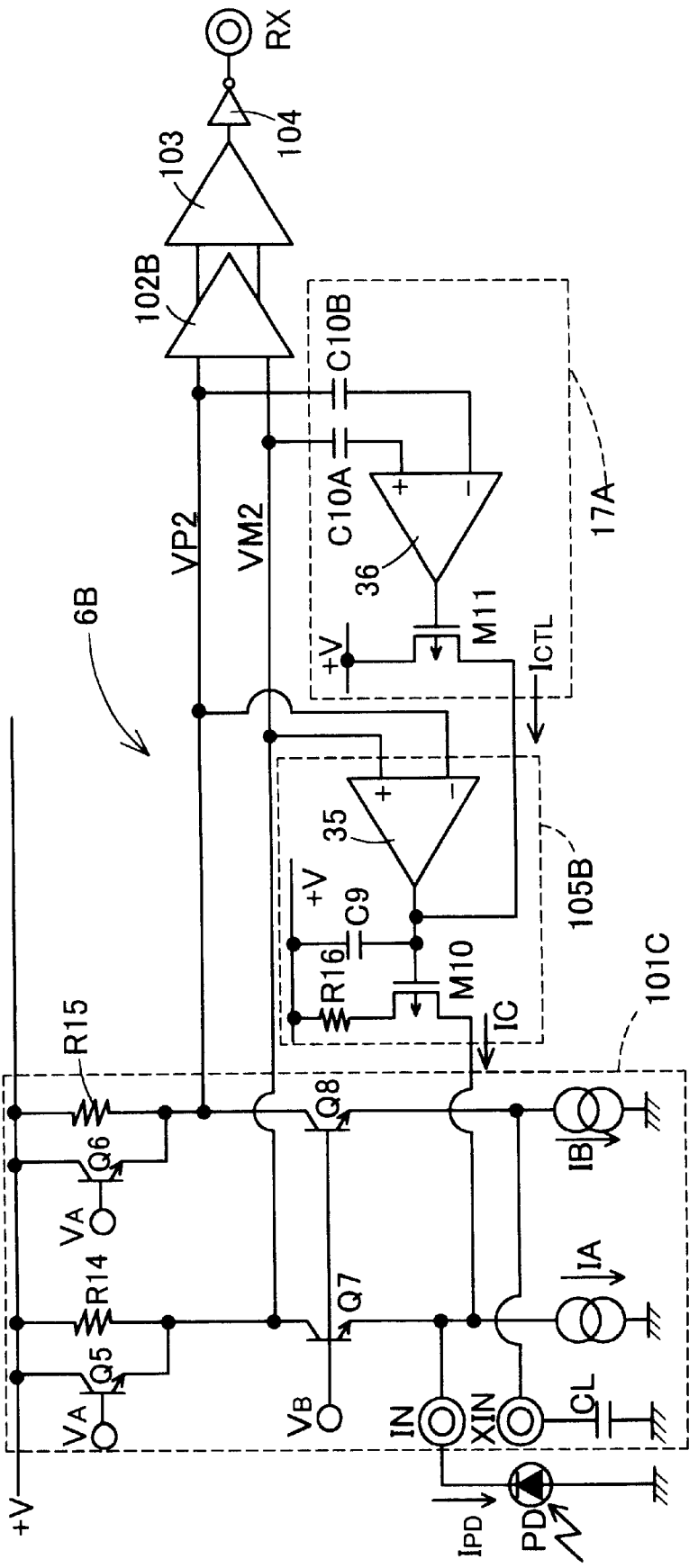
FIG. 17 is a circuit block diagram showing a second example of the current pulse receiving circuit according to the sixth embodiment.

A current pulse receiving circuit 6B of a second example according to the sixth embodiment shown in FIG. 17 has a DC cancellation circuit 105B and a large signal detection circuit 17A, both configured as differential inputs. It offers the same effects and benefits as those provided by the first example of single-input configuration. The input terminal of a current-to-voltage converter circuit 101C is also configured as differential inputs IN and XIN. A capacitive component CL is connected the non-input terminal side XIN of these differential inputs IN and XIN so as to achieve a balance with a load component which a photodiode PD connected to the input terminal side IN has. It is further possible to add resistor or other components. The circuit balance of the current-to-voltage converter circuit 101C is improved for better characteristics and, at the same time, the same effects and benefits as in the first example can be derived.

Figure 18:
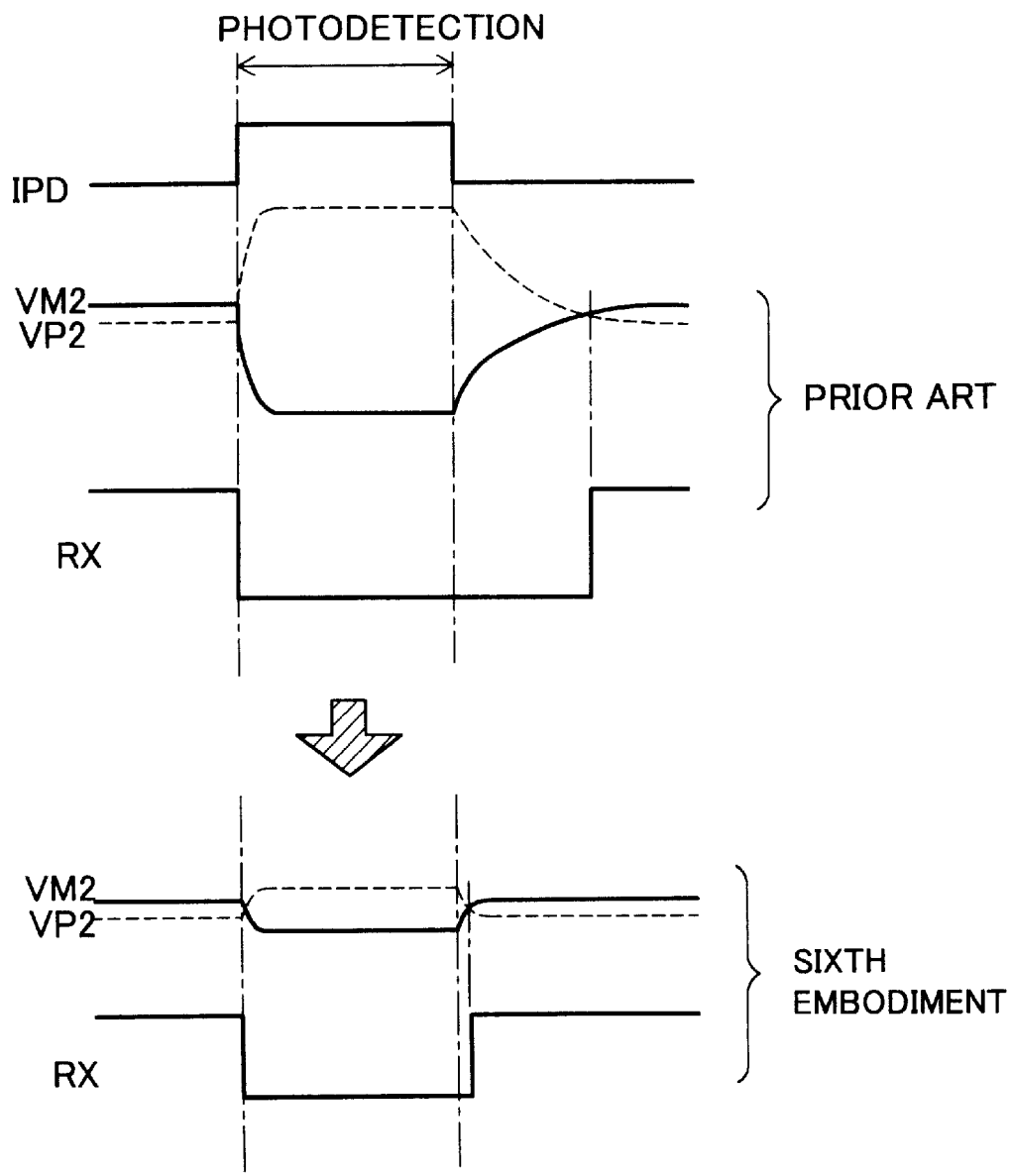
FIG. 18 shows input and output waveforms of the second example of the current pulse receiving circuit according to the sixth embodiment.

FIG. 18 shows improvements made on the second related art, as embodied in the second example of the sixth embodiment. As in the case of FIG. 16, the amplitude of the input signal VM2 of the amplifier circuit 102B is limited properly, tail characteristics at the trailing edge of the pulse are small, and an accurate pulse width is provided at the output terminal RX.

The configuration exemplified in the sixth embodiment uses the output current ICTL of large amplitude detection circuits 17 and 17A for controlling the current IC of the DC cancellation circuit 105A. This does not, however, represent the only possible configuration; the same operation can be effected through a configuration in which the output current ICTL is directly input to the input terminal IN of current-to-voltage converter circuits 101B and 101C.

According to the current pulse receiving circuits 6B and 6A of the sixth embodiment, differences in output characteristics of the photodiode PD that converts a light pulse to a corresponding current pulse and tail characteristics of the differentiated waveform of the pulse signal, in addition to differences of strong and weak light pulse signals involved in the IrDA and other optical communications, can be absorbed to ensure a stabilized output of an output pulse width which accurately coincides with the pulse width of an input light pulse.

According further to the current-to-voltage converter circuits 101B and 101C in the current pulse receiving circuits 6B and 6A of the sixth embodiment, a bias circuit can be set so as to make the emitter-follower transistors Q5 and Q6 conductive according to the output signal from the large signal detection circuit. This allows the conducting current for the emitter-follower transistors Q5 and Q6 to be logarithmic characteristics of a forward junction voltage, thus easily reducing the current-to-voltage conversion resistance of the current-to-voltage converter circuits 101B and 101C. In addition, making the emitter transistors Q5 and Q6 conductive will reduce the output resistance, which allows the clamp level of the output voltage amplitude of the current-to-voltage converter circuits 101B and 101C to be easily reduced.

Figure 19:
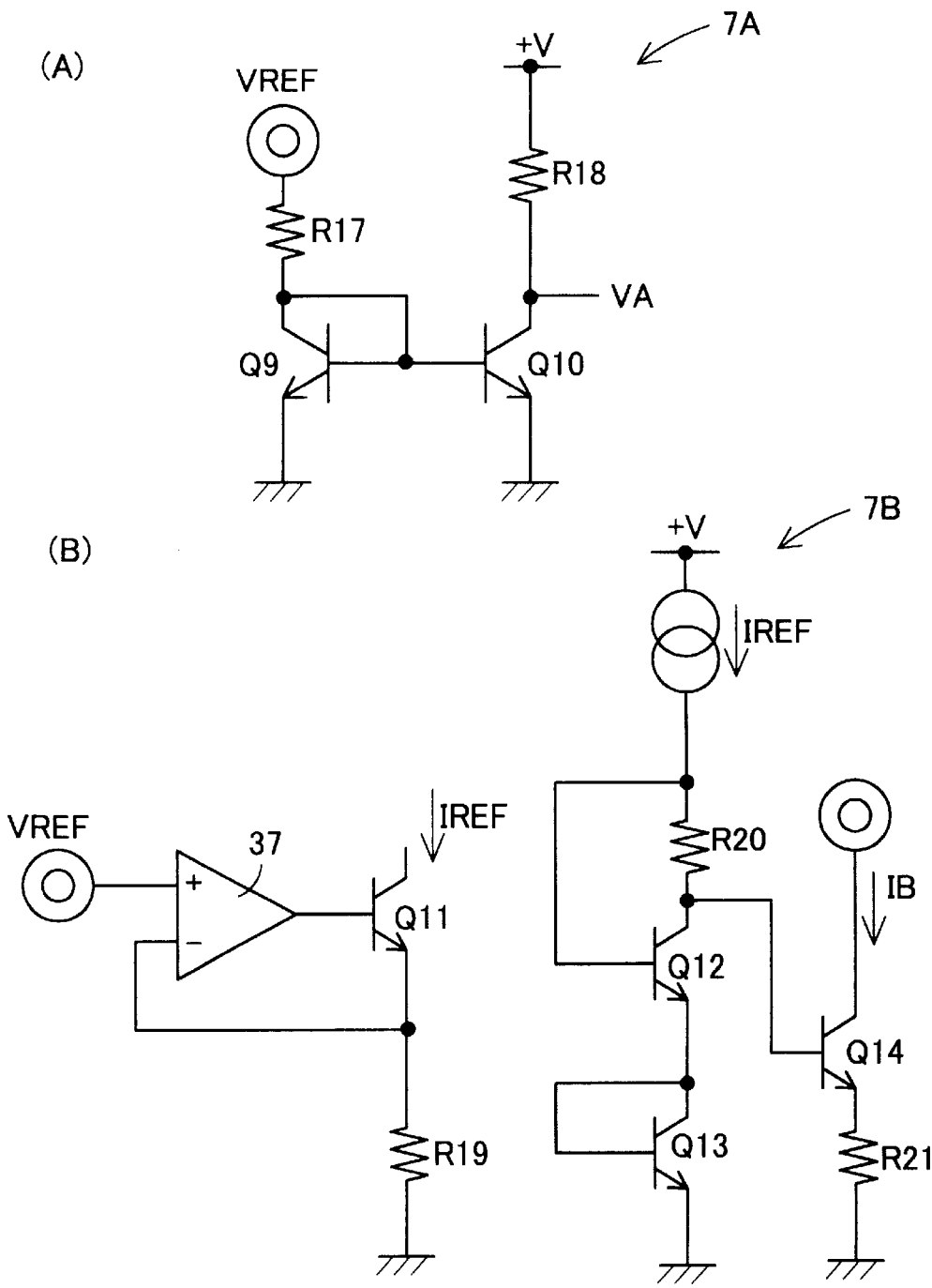
FIG. 19 is a circuit diagram showing a temperature characteristics cancellation bias circuit for a current-to-voltage converter circuit in a current pulse receiving circuit according to a seventh embodiment.

Temperature cancellation bias circuits 7A and 7B according to a seventh embodiment shown in FIG. 19 work in the current-to-voltage converter circuits 101B and 101C of the current pulse receiving circuit with small signals. They cancel temperature characteristics of the clamp transistor Q5 (see FIG. 14, or FIGS. 17 and 25) to reduce a leak current of the clamp transistor Q5 at high temperatures, thereby obtaining a constant current-to-voltage conversion resistance over a wide temperature range. The temperature cancellation bias circuit 7A shown in (A) of FIG. 19 is an example in which temperature characteristics which function to control temperature characteristics of the transistor Q5 are given to a bias voltage VA, as opposed to the configuration depicted in FIG. 17, or others in which the bias voltage VA is applied to the base terminal of the clamp transistor Q5. The temperature cancellation bias circuit 7B shown in (B) of FIG. 19 is an example in which temperature characteristics which function to control temperature characteristics of the transistor Q5 are given to the constant current source circuit IB that forms the current-to-voltage converter circuits 101B and 101C in FIGS. 14 and 17 etc.

In the temperature cancellation bias circuit 7A shown in FIG. 19(A), transistors Q9 and Q10 form a current mirror circuit. A resistor component R17 is connected across a reference voltage VREF and a collector terminal of the transistor Q9 whose base and collector terminals are diode-connected, and a resistor component R18 is connected across a power source voltage +V and a collector terminal of the transistor Q10.

A constant current [(VREF−VBE)/R17] determined by the resistor component R17 and the transistor Q9 is duplicated in the transistor Q10 side to flow through the resistor component R18, resulting in a bias voltage VA across the resistor component R18 and the transistor Q10 being the following:

$$VA=(+V)-R18\times(VREF-VBE)/R17$$

wherein, the reference voltage VREF is independent of temperature and remains constant, and it is possible to control temperature characteristics if the same resistor type is used for (R18/R17). This bias voltage VA is applied to the base terminal of the clamp transistor Q5 shown in FIG. 17 etc., being biased to the base terminal so that the voltage across the base and emitter of the clamp transistor Q5 becomes greater in high temperatures, thus allowing a leak current to be controlled at high temperatures.

In the temperature cancellation bias circuit 7B shown in FIG. 19(B), a reference voltage VREF is input to the positive input terminal of an amplifier 37 and the output terminal is connected to a base terminal of a transistor Q11. An emitter terminal of the transistor Q11 is fed back to the negative input terminal of the amplifier 37, while at the same time being connected through a resistor component R19 to a ground potential. A constant current IREF flows through a resistor component R20 and a base terminal of a transistor Q12 at the output portion of a bias current IB. The other end of the resistor component R20 is connected to a collector terminal of the transistor Q12 and to a base terminal of the transistor Q14. The emitter terminals of the transistors Q12 and Q14 are connected to a ground potential through a diode-connected transistor Q13 and a resistor component R21, respectively.

Because of the reference voltage VREF applied to the resistor component R19 by the functioning of the amplifier 37, the constant current IREF is output as IREF=VREF/R19, wherein a voltage VR20 developing across both ends of R20 is:

$$VR20=R20\times IREF=VREF\times(R20/R19)$$

Since both the reference voltage VREF and the ratio of resistors of the same type (R20/R19) remain constant independent of temperature, VR20 is also a constant value. To extract a bias current IB using the VR20, the following holds true:

$$IB=[(2\times VBE-VR20)-VBE]/R21$$

where the former VBE is that of the transistors Q12 and Q13 and the latter VBE is that of the transistor Q14. Having the same current flow through each of these transistors Q12, Q13, and Q14 can be achieved easily by adjusting the parameters for each component. It is therefore possible to have the same VBE and hence the following equation:

$$IB=(VBE-VR20)/R21$$

Since ID=IB with a small signal amplitude, the following voltage is applied across the base and emitter terminals of the clamp transistor Q5 in FIG. 14:

$$R14\times IB=(VBE-VR20)\times(R14/R21)$$

wherein both VR20 and (R14/R21) remain constant, independent of temperature. The temperature characteristics in R14×IB are therefore the same as those of the VBE voltage of transistors Q12, Q13, and Q14. Since this bias voltage R14×IB is applied as the voltage across the base and emitter terminals of the clamp transistor Q5 of FIG. 14, it is biased with the same temperature characteristics as those of the VBE voltage of the clamp transistor Q5, thus suppressing the temperature characteristics of the clamp transistor Q5 and a leak current at high temperatures.

According to the seventh embodiment, aggravation of leak current characteristics of the emitter-follower transistor at high temperatures can be prevented and a constant reduction in current-to-voltage conversion resistance over a wide temperature range and a reduction in the clamp level of the output voltage amplitude can be obtained.

Figure 20:
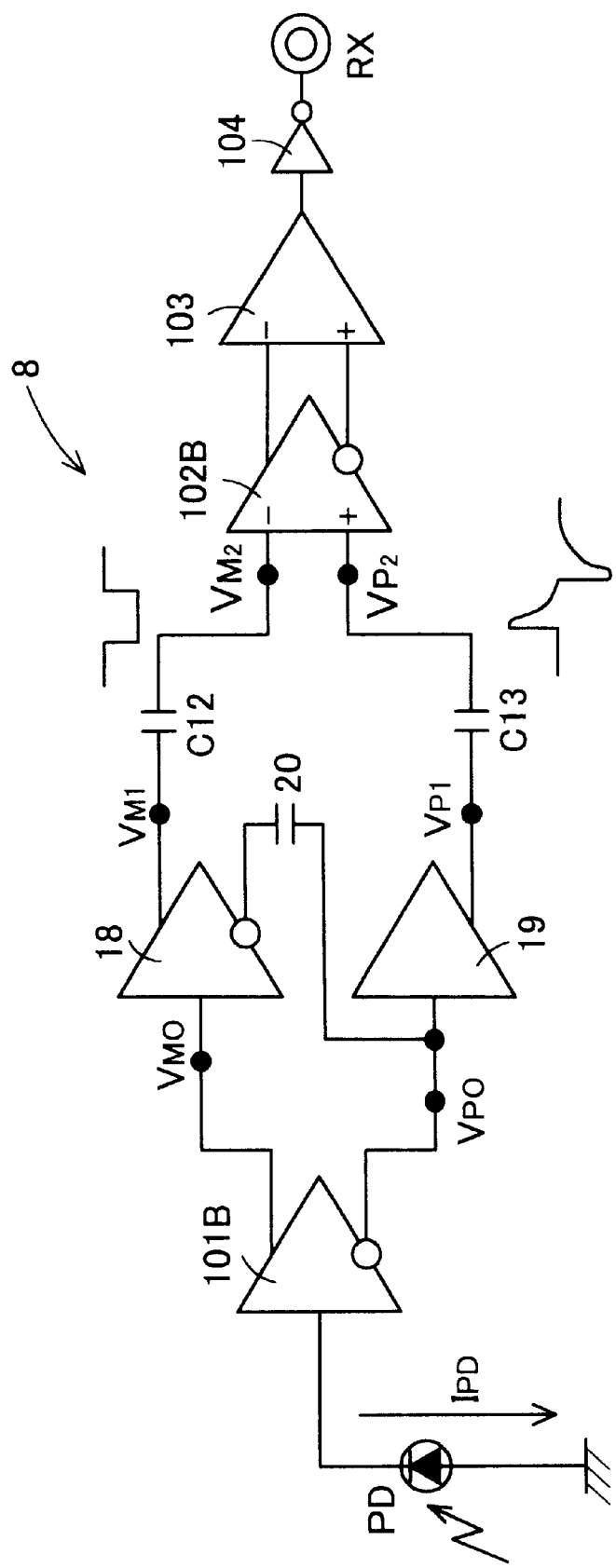
FIG. 20 is a circuit block diagram showing a current pulse receiving circuit according to an eighth embodiment.

In the circuit diagram showing a current pulse receiving circuit 8 according to an eighth embodiment shown in FIG. 20, differential output terminals VM0 and VP0 of a current-to-voltage converter circuit 101B are connected to differential input terminals VM2 and VP2, respectively, of an amplifier circuit 102B through the buffers 18 and 19. More precisely, buffers 18 and 19 are of a differential output terminal configuration and noninverting output terminals VM1 and VP1 of the buffers 18 and 19, respectively, are connected to differential input terminals VM2 and VP2 of the amplifier circuit 102B through capacitive components C12 and C13 for capacitive coupling. An inverting output terminal of the buffer 18 is connected to an input terminal of the buffer 19 through a differentiating circuit 20 formed by capacitive components.

In the eighth embodiment, low frequencies are cut to ensure that an input signal to the amplifier circuit 102B is input through the capacitive components C12 and C13 to propagate an input current pulse IPD effectively. By setting a capacitive value for the capacitive components forming the differentiating circuit 20 to a smaller value with respect to the capacitive components C12 and C13, only the frequency components higher than the input pulse are allowed to pass through the differentiating circuit 20. Since an inverting signal of the input pulse is input to the differentiating circuit 20, a voltage signal, which is made steep as a result of differentiation performed in a direction opposite to the amplitude of the input pulse, appears in an output thereof. When this differentiated voltage signal is applied to the noninverting input terminal VP2 of the amplifier circuit 102B through the buffer 19 and the capacitive component C13, a dynamic hysteresis is obtained that shifts in a direction opposite that of an amplitude shifting direction of the input signal to the inverting input terminal VM2.

Figure 21:
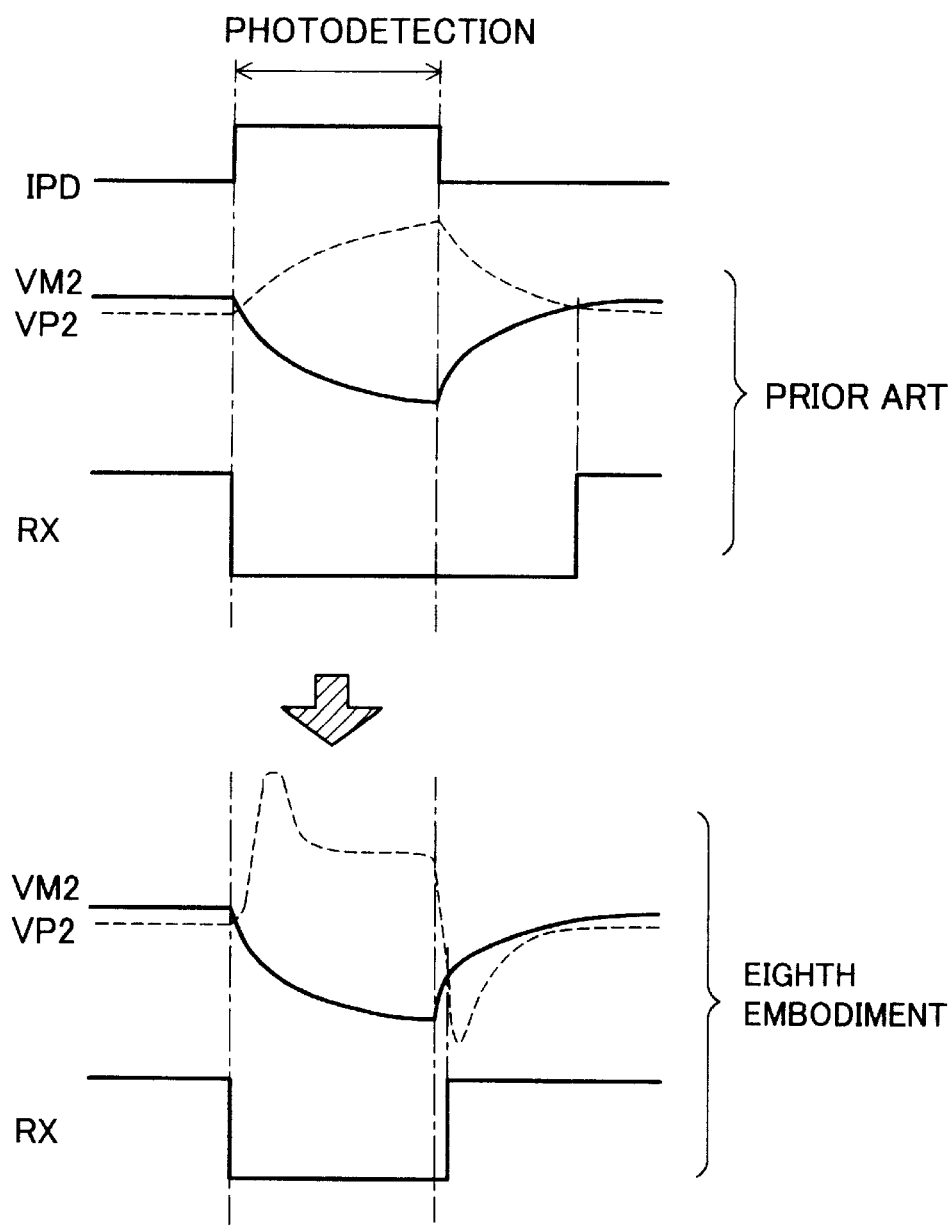
FIG. 21 shows input and output waveforms when the input to an amplifier circuit according to the eighth embodiment is a differential input.
Figure 33:
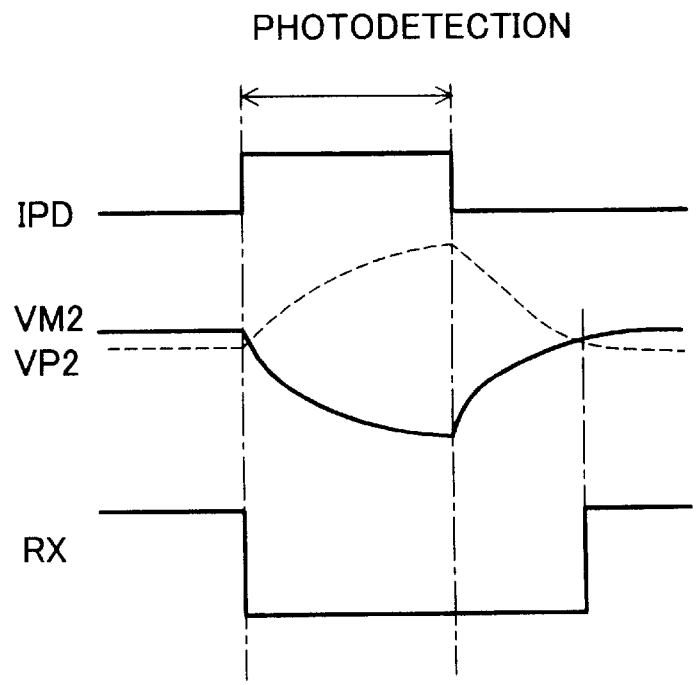
FIG. 33 shows input and output response waveforms of the amplifier circuit under a low intensity in the light pulse receiving circuit according to the second related art.

The waveforms at this time are shown in the lower half of FIG. 21. It is evident that, as compared with the waveforms (see FIG. 33) according to the second related art shown in the upper half of FIG. 21, a steep waveform differentiated in the opposite direction is applied to the input terminal VP2 when the input pulse undergoes an amplitude shift, allowing the pulse to accurately follow the trailing edge of the input pulse, thus providing an accurate pulse output on the output terminal RX with the input signals VM2 and VP2 of the amplifier circuit 102B crossing.

Figure 22:
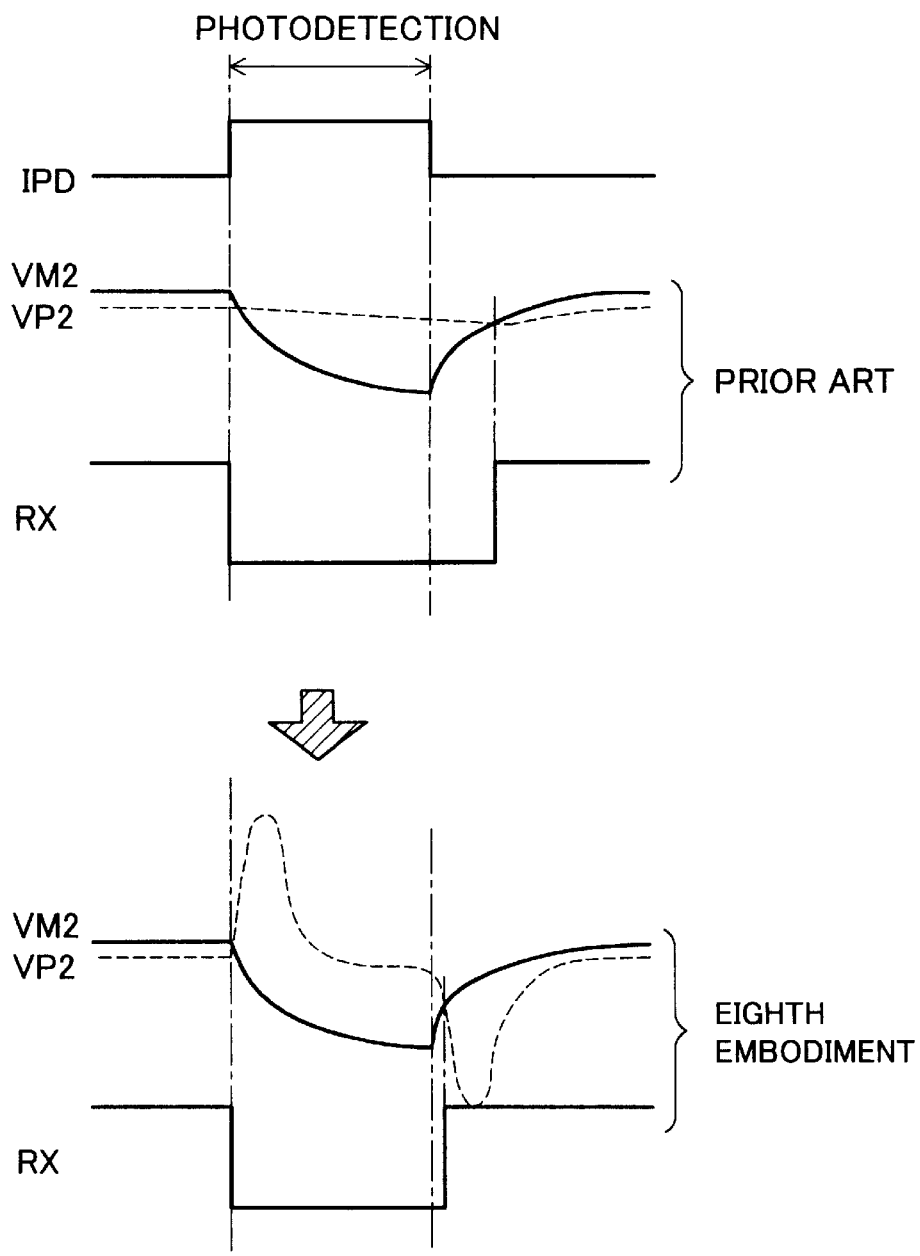
FIG. 22 shows input and output waveforms when the input to the amplifier circuit according to the eighth embodiment is a single input.

The eighth embodiment exemplifies an application to the second related art. It is nonetheless possible to apply it to the first related art. FIG. 22 shows the waveforms of the input signals VM2 and VP2 to the amplifier circuit 102A in this application. It is evident that, as in the case of FIG. 21, a dynamic hysteresis can also be realized in this case, shifting steeply in the opposite direction when the pulse amplitude shifts, thus providing an accurate pulse output at the output terminal RX.

In FIG. 20, a configuration was exemplified in which buffers 18 and 19 were provided for each of the differential signals. The same effect can still be produced even without the buffer 19, as long as the buffer 18 is provided that outputs input signals for the differentiating circuit 20.

Furthermore, in the exemplified configuration, the output signal from the differentiating circuit 20 is such as to be superimposed on the input signal to the buffer 19. This is not, however, the only possible configuration; the node can be at any point as long as it permits superimposition of the differentiated signal waveform. The same effect can be derived when the connection is made to a node, such as the noninverting input terminal VP2 of the amplifier circuit 102B or any other high impedance node, that can effectively superimpose the differentiated signal waveform.

Figure 23:
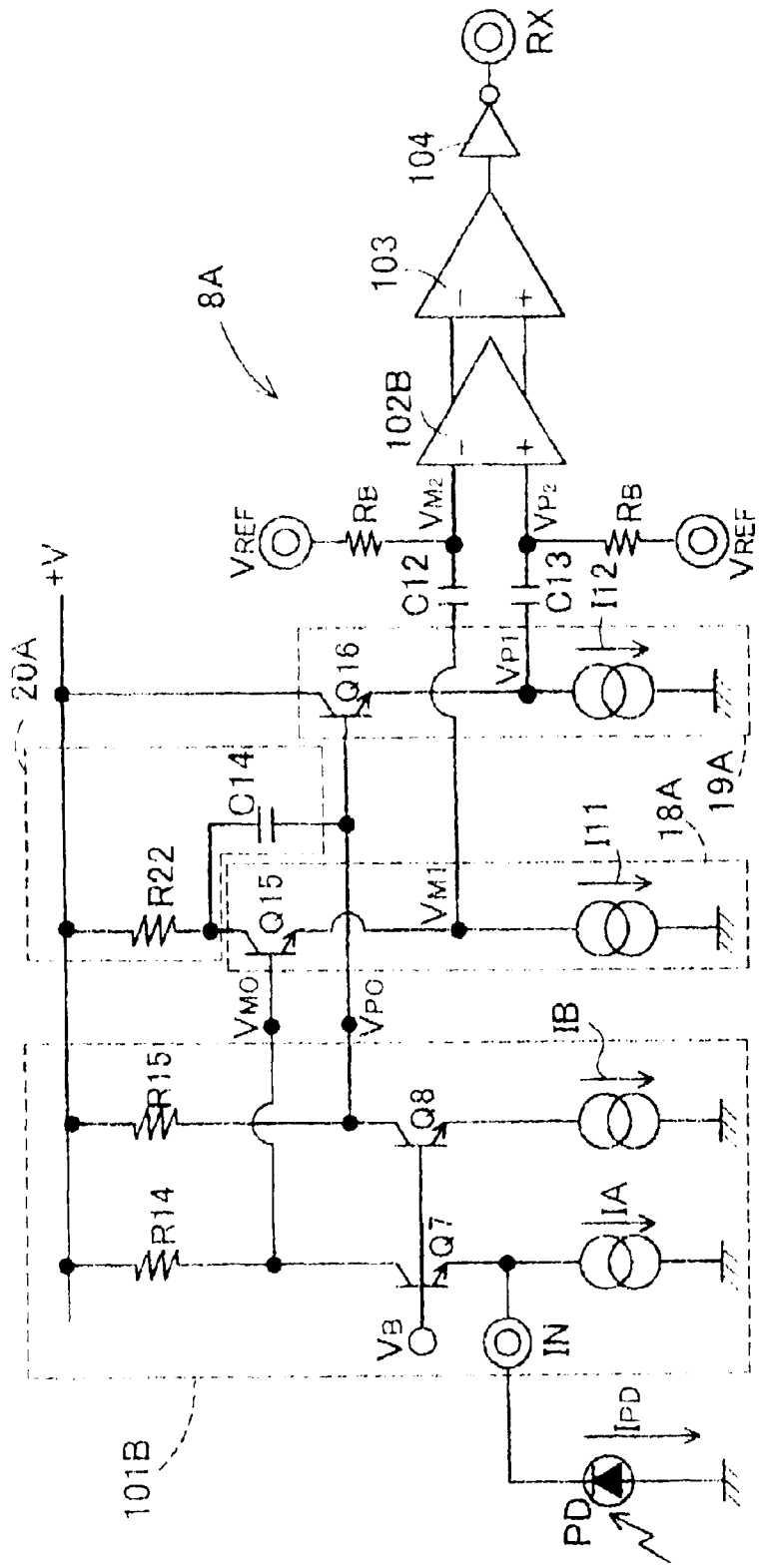
FIG. 23 is a circuit diagram showing a typical current pulse receiving circuit according to the eighth embodiment.

A current pulse receiving circuit 8A as an example of the eighth embodiment shown in FIG. 23 is provided with, as buffers, a buffer 18A formed by an emitter-follower transistor Q15 biased with a constant current source circuit I11 and a buffer 19A formed by an emitter-follower transistor Q16 biased with a constant current source circuit I12. It is also provided with, as a differentiating circuit, a differentiating circuit 20A formed by a capacitive component C14 and a resistor component R22. The capacitive component C14 and the resistor component R22 are connected to a collector terminal of a transistor Q15 of the buffer 18A, while the other end of the resistor component R22 is connected to a power source voltage +V and the other end of the capacitive component C14 is connected an input terminal of the buffer 19A.

Of the two buffers 18A and 19A, the buffer 18A having a connection to the differentiating circuit 20A will now be noted. A capacitive component C12 connected to an output terminal of the emitter-follower transistor Q15 that forms the buffer 18A is discharged by the constant current source circuit I11. It therefore requires a predetermined period of time for transition of the output signal from the buffer 18A with respect to an ending transition of the pulse signal to the buffer 18A. The transition time Δt can be easily obtained as a constant current discharge from the capacitive component C12, given by the following:

$$\Delta t = C12 \times \Delta VM1/I11$$

Since the constant current I11 from the constant current source circuit I11 flows from the capacitive component C12 during this transition time Δt, current in the transistor Q15 decreases. Therefore, the voltage level at a collector terminal of the transistor Q15 increases during this period of time and a signal therefrom behaves as if it were a differentiated inverting signal. A voltage change ΔV at this time is as follows, supposing the emitter current and the collector current of the transistor Q15 are equal.

$$\Delta V = R22 \times I11$$

The voltage increase ΔV during the period Δt is applied to a base terminal of the transistor Q16, which is an input terminal to the other buffer 19A, through the capacitive component C14 to an output terminal VP1 of the buffer 19A by emitter-follower characteristics, and further, to a noninverting input terminal VP2 of the amplifier circuit 102B through a capacitive component C13, thus allowing a dynamic hysteresis to be superimposed.

According the current pulse receiving circuit 8 of the eighth embodiment, a differentiated signal is superimposed without fail, since the node to which a differentiated signal is input has high impedance. Even when a rounded current pulse IPD at the transition portion of a pulse is input, a differentiated waveform of an inverting signal is used as the hysteresis waveform, which allows sufficient hysteresis effects to be derived and a pulse with an accurate pulse width to be output.

An output of an accurate pulse width can be obtained even when a small-amplitude light pulse is applied in the IrDA or other optical communications and when rounding of the transition portion of a current pulse IPD occurs due to prominent output characteristics of the photodiode PD.

Figure 24:
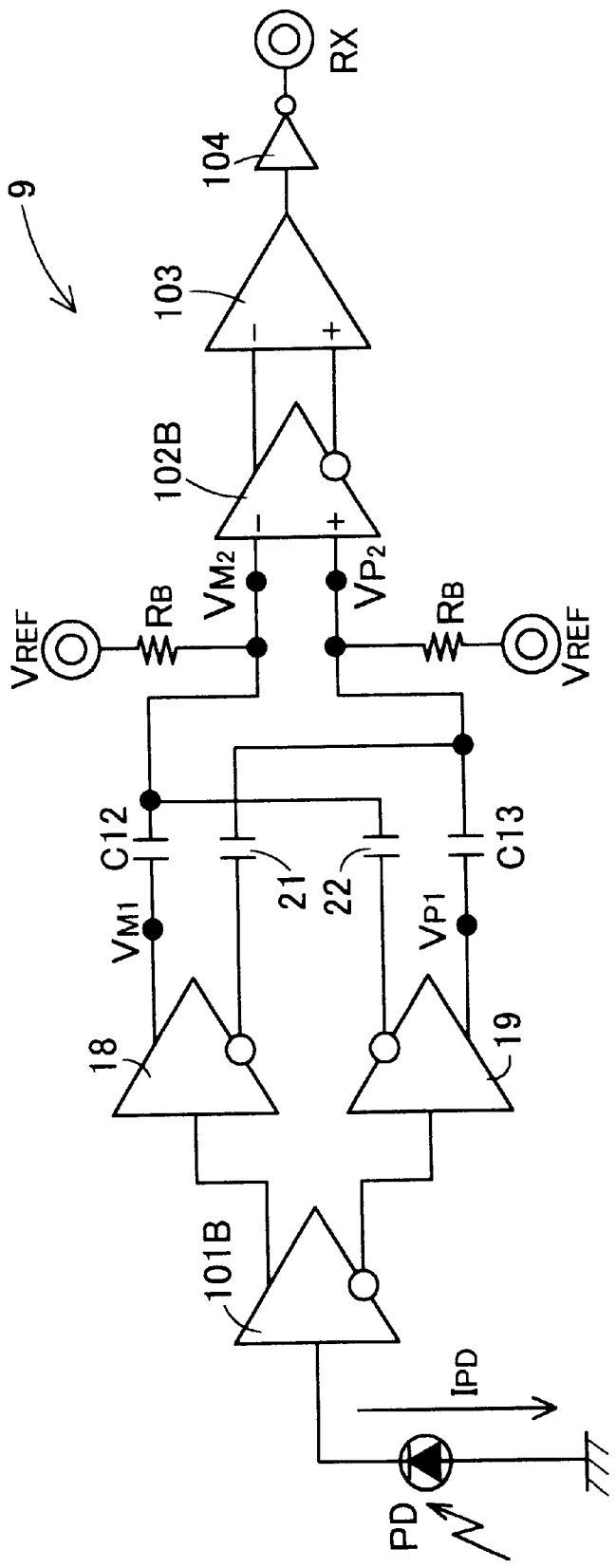
FIG. 24 is a circuit block diagram showing a current pulse receiving circuit according to a ninth embodiment.

The circuit diagram of a current pulse receiving circuit 9 according to a ninth embodiment shown in FIG. 24 represents a configuration, in which symmetry in circuit connection has been improved and a better balance of circuit operations achieved over the current pulse receiving circuit 8 of the eighth embodiment. A differentiating circuit 21, used in place of the differentiating circuit 20 in the eighth embodiment and connected to an inverting output terminal of a buffer 18, is connected to a noninverting input terminal VP2 of an amplifier circuit 102B. In addition, a differentiating circuit 22 is connected to an inverting output terminal of a buffer 19 and to a noninverting input terminal VM2 of the amplifier 102B.

On a noninverting input signal input to the input terminal VM2 through a capacitive component C12 from a noninverting output terminal VM1 of the buffer 18, a differentiated wave form of a signal, which is the result of inversion of an inverted output signal, is superimposed so as to emphasize the pulse transition portion of the noninverting input signal. On an inverting input signal input to the input terminal VP2 through a capacitive component C13 from a noninverting output terminal VP1 of the buffer 19, a differentiated waveform of a signal, which is the result of inversion of a noninverted output signal, is superimposed so as to emphasize the pulse transition portion of the inverting input signal. Dynamic hysteresis is superimposed on each of the input signals of the amplifier circuit 102B.

Since symmetry in circuit connection is achieved in the ninth embodiment, PSRR is strengthened and a circuit configuration is realized that eliminates malfunctions caused by fluctuations in the power source voltage and other power source noises.

Figure 25:
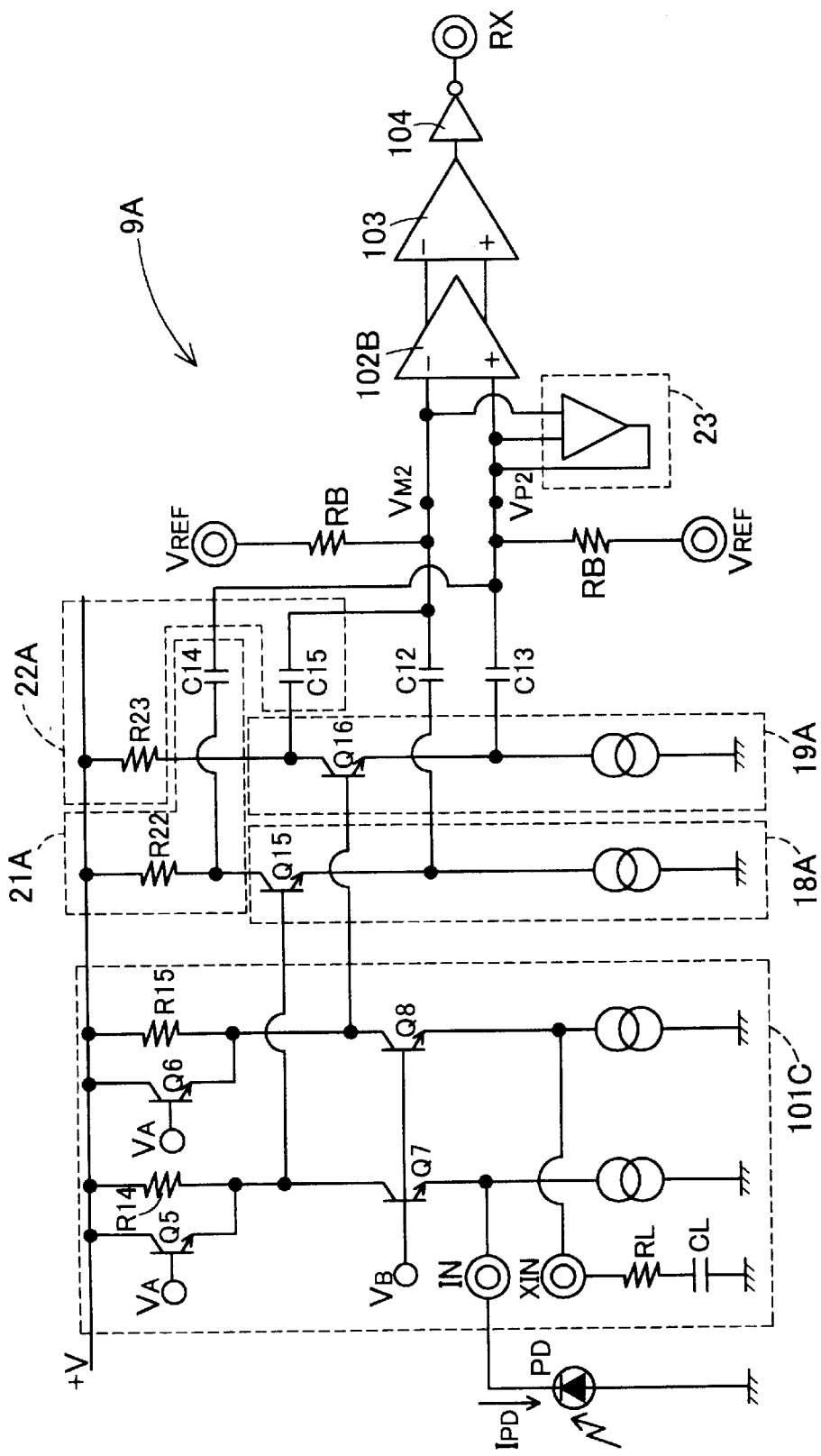
FIG. 25 is a circuit diagram showing a typical current pulse receiving circuit according to the ninth embodiment.
Figure 26:
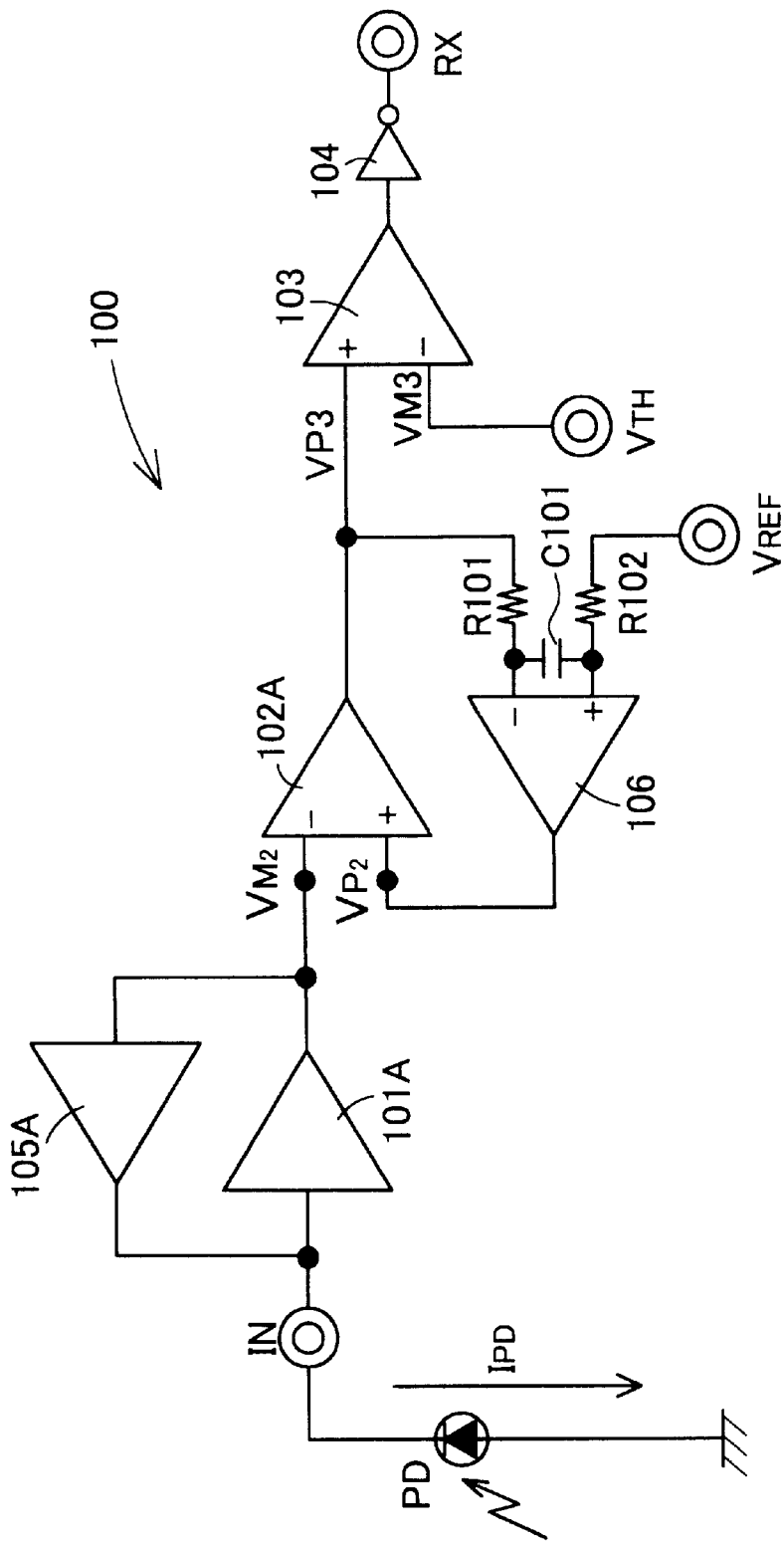
FIG. 26 is a circuit block diagram showing a light pulse receiving circuit according to a first related art.
Figure 27:
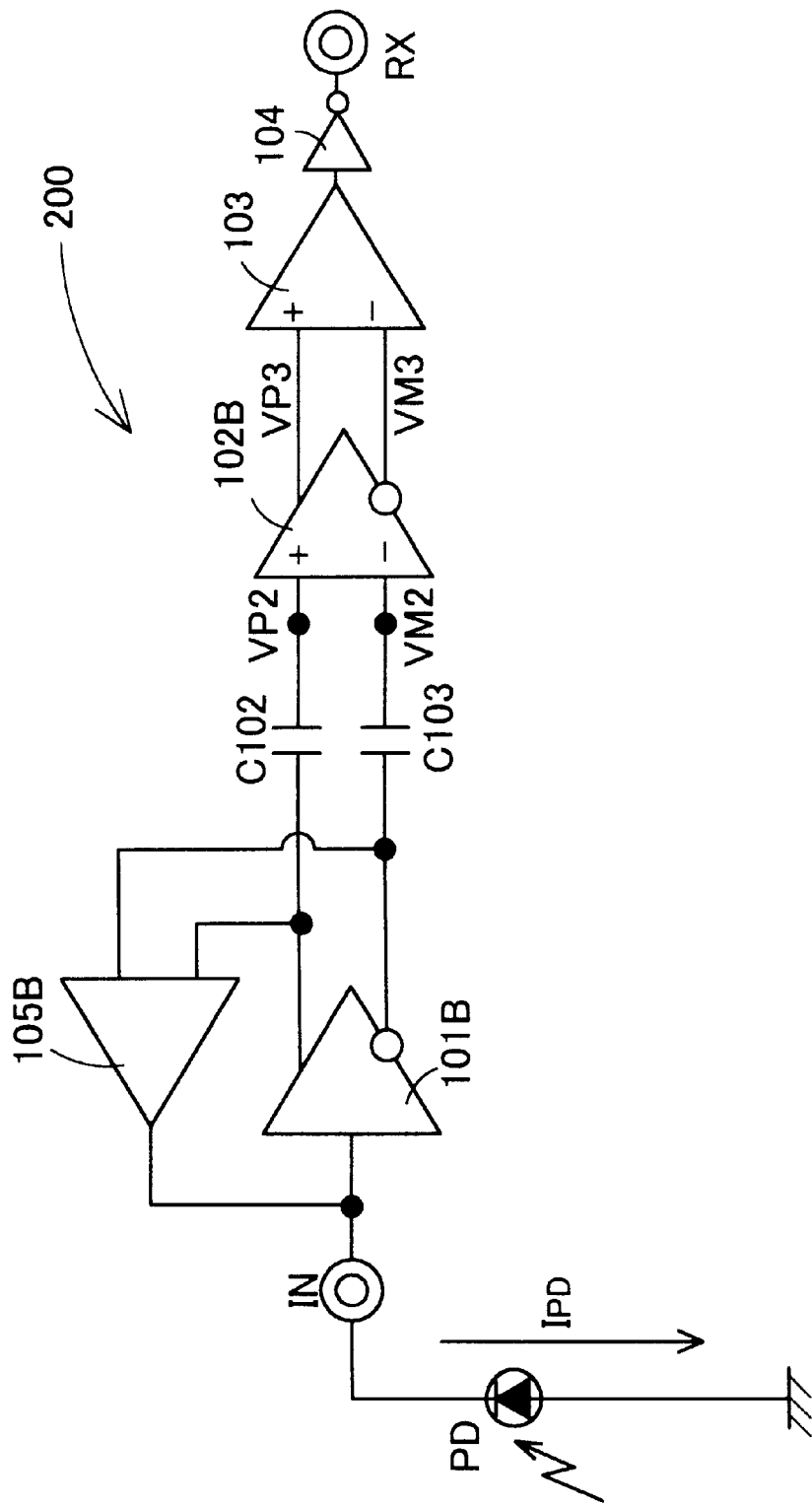
FIG. 27 is a circuit block diagram showing a light pulse receiving circuit according to a second related art.
Figure 28:
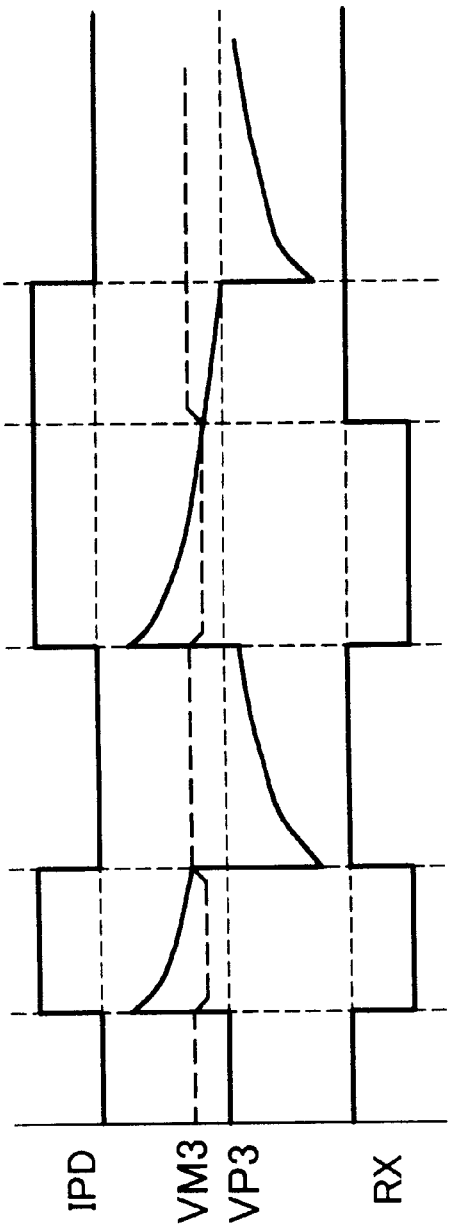
FIG. 28 shows input and output response waveforms of a comparator circuit in the light pulse receiving circuit according to the first related art.
Figure 29:
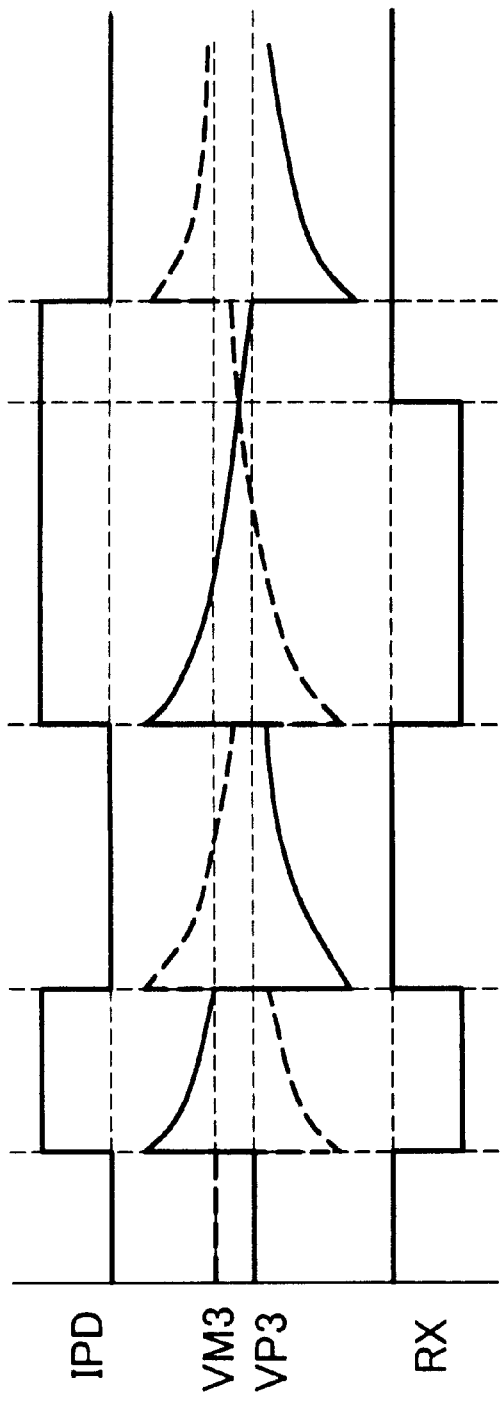
FIG. 29 shows input and output response waveforms of a comparator circuit in the light pulse receiving circuit according to the second related art.

Referring to the example shown in FIG. 25, this configuration represents the example of the eighth embodiment shown in FIG. 23, to which a differentiating circuit 22A from a buffer 19A to a buffer 18A has been added. Furthermore, an automatic threshold value adjustment circuit (ATC: Automatic Threshold Control) 23 is provided for input terminals VM2 and VP2 of an amplifier circuit 102B. The differentiating circuits 21A and 22A that perform the same operations as the differentiating circuit 20A in the eighth embodiment are provided for the buffers 18A and 19A, respectively, for improved circuit symmetry. The automatic threshold value adjustment circuit (ATC) 23 allows a difference between input signals at the input terminals VM2 and VP2 of the amplifier circuit 102B to be maintained within a predetermined range, thus enabling the response characteristics according to the difference in input signals at the amplifier circuit 102B to be kept within a predetermined range.

According to the current pulse receiving circuit 9 of the ninth embodiment, circuit symmetry can be ensured at each of the input terminals VM2 and VP2 of the amplifier circuit 102B, which means that a load, noise, and other disturbances, and fluctuations in the power source voltage +V along a signal path reaching each of the input terminals VM2 and VP2 act equally on both signal paths, thus ensuring stabilized operations also for these fluctuations.

It is to be understood that the invention is not limited to the first through ninth embodiments and that various improvements and modifications may be made in the invention without departing from the spirit and scope thereof.

Not only various improvements and modifications can be made in the invention as described in each of the embodiments, but also a configuration is possible in which the type of component transistors is changed from the bipolar type to a MOS type, or vice versa, in addition to the improvements and modifications described herein. Moreover, the invention may be applied to both of the differential input/output and single-phase input/output configurations.

While the invention has been described with reference to the case in which light pulses are received, it is not limited to such applications and can be applied to a system that receives a physical quantity other than light, such as temperature, pressure, and acceleration, and converts the input to a corresponding current.

According to the present invention, it is possible to provide a current pulse receiving circuit that is capable of converting a current pulse, which has been converted by a photodetector from a light pulse received in an optical communications system, to a corresponding voltage pulse with an accurate logic level, regardless of whether the pulse amplitude is great or small, and whether the pulse width is long or short.

What is claimed is:

1. A current pulse receiving circuit comprising:

a current-to-voltage converter circuit that coverts an input current pulse to a voltage pulse;

an amplifier circuit of a differential input configuration that performs amplification according to an output signal from the current-to-voltage converter circuit; and one pair of buffer circuits of a differential output configuration that is inserted between the current-to-voltage converter circuit and the amplifier circuit;

wherein an in-phase output terminal of the pair of buffer circuits is connected to a differential input terminal of the amplifier circuit through a capacitor element, and wherein an inverted output terminal of one of the pair of buffer circuits is connected to an input terminal of the other one of the pair of buffer circuits through a differential circuit constituted by another capacitor element.

2. A current pulse receiving circuit comprising:

a current-to-voltage converter circuit that converts an input current pulse to a voltage pulse;

an amplifier circuit of a differential input configuration that performs amplification according to an output signal from the current-to-voltage converter circuit;

one pair of buffer circuits of a differential output configuration that is inserted between the current-to-voltage converter circuit and the amplifier circuit and supplies each of input signals to the amplifier circuit; and a differentiating circuit that differentiates at least one of the inverted outputs of the pair of buffer circuits and supplies this differentiated inverted output to an input terminal of the other buffer circuit.

3. A current pulse receiving circuit comprising:

a current-to-voltage converter circuit that converts an input current pulse to a voltage pulse;

an amplifier circuit of a differential input configuration that performs amplification according to an output signal from the current-to-voltage converter circuit;

one pair of buffer circuits of a differential output configuration that is inserted between the current-to-voltage converter circuit and the amplifier circuit and supplies each of input signals to the amplifier circuit; and a pair of symmetrically disposed differentiating circuits that differentiates each of the inverted outputs from the pair of buffer circuits and supplies each differentiated inverted output to each input terminal of the other buffer circuit.

4. A current pulse receiving circuit comprising:

a current-to-voltage converter circuit that converts an input current pulse to a voltage pulse;

an amplifier circuit of a differential input configuration that performs amplification according to an output signal from the current-to-voltage converter circuit;

a buffer circuit of a differential output configuration that is inserted between the current-to-voltage converter circuit and the amplifier circuit;

a differentiating circuit that differentiates an inverted output from the buffer circuit and supplies this differentiated inverted output to a node having a high impedance of the other input signal line to the amplifier circuit; and capacitive coupling components that supply an input signal to the amplifier circuit through capacitive coupling;

wherein the buffer circuit is provided with an emitter-follower transistor and a constant current source circuit which is connected to an emitter terminal of the emitter-follower transistor and which supplies a bias current; and the differentiating circuit is provided with a differentiating resistance component that is connected between a collector terminal of the emitter-follower transistor and a predetermined potential and a differentiating capacitive component that is connected between the collector terminal and the other input signal line.

5. A current pulse receiving circuit comprising:

a current-to-voltage converter circuit that converts an input current pulse to a voltage pulse;

an amplifier circuit of a differential input configuration that performs amplification according to an output signal from the current-to-voltage converter circuit;

a buffer circuit of a differential output configuration that is inserted between the current-to-voltage converter circuit and the amplifier circuit;

a differentiating circuit that differentiates an inverted output from the buffer circuit and supplies this differentiated inverted output to a node having a high impedance of the other input signal line to the amplifier circuit; and capacitive coupling components that supply an input signal to the amplifier circuit through capacitive coupling;

wherein the buffer circuit is provided with a source-follower transistor and a constant current source circuit which is connected to a source terminal of the source-follower transistor and which supplies a bias current; and the differentiating circuit is provided with a differentiating resistance component that is connected between a drain terminal of the source-follower transistor and a predetermined potential and a differentiating capacitive component that is connected between the drain terminal and the other input signal line.

* * * * *